US012669752B2

(12) United States Patent
Niimi et al.

(10) Patent No.: US 12,669,752 B2
(45) Date of Patent: Jun. 30, 2026

(54) EXTREME ULTRAVIOLET LIGHT GENERATION SYSTEM AND ELECTRONIC DEVICE MANUFACTURING METHOD

(71) Applicant: Gigaphoton Inc., Tochigi (JP)

(72) Inventors: Gouta Niimi, Oyama (JP); Kotaro Miyashita, Oyama (JP)

(73) Assignee: Gigaphoton Inc., Tochigi (JP)

( * ) Notice: Subject to any disclaimer, the term of this patent is extended or adjusted under 35 U.S.C. 154(b) by 734 days.

(21) Appl. No.: 18/047,587

(22) Filed: Oct. 18, 2022

(65) Prior Publication Data

US 2023/0161262 A1 May 25, 2023

(30) Foreign Application Priority Data

Nov. 19, 2021 (JP) ................................. 2021-188299

(51) Int. Cl.
*G03F 7/00* (2006.01)

(52) U.S. Cl.
CPC ...... *G03F 7/70033* (2013.01); *G03F 7/70025* (2013.01); *G03F 7/70041* (2013.01); *G03F 7/70166* (2013.01); *G03F 7/7055* (2013.01)

(58) Field of Classification Search
CPC ............. G03F 7/70033; G03F 7/70025; G03F 7/70041; G03F 7/70166; G03F 7/7055
See application file for complete search history.

(56) References Cited

U.S. PATENT DOCUMENTS

| | | | |
|---|---|---|---|
| 8,525,140 B2 | 9/2013 | Abe et al. | |
| 10,514,167 B1* | 12/2019 | Tsai | H05G 2/008 |
| 2005/0271957 A1* | 12/2005 | Miyachi | G03F 7/70316 |
| | | | 430/30 |
| 2010/0140512 A1 | 6/2010 | Suganuma et al. | |

(Continued)

FOREIGN PATENT DOCUMENTS

| | | |
|---|---|---|
| EP | 2 453 218 A1 | 5/2012 |
| JP | 2007-109451 A | 4/2007 |

OTHER PUBLICATIONS

Search Report issued in NL 2033232 by the Netherlands Patent Office on Aug. 26, 2025, which is related to U.S. Appl. No. 18/047,587; with English language explanation.

*Primary Examiner* — Georgia Y Epps
*Assistant Examiner* — Hanway Chang
(74) *Attorney, Agent, or Firm* — Studebaker Brackett PLLC

(57) ABSTRACT

An extreme ultraviolet light generation system includes a chamber, a target supply unit supplying a target substance to a plasma generation region including a first point in the chamber, a window allowing pulse laser light with which the target substance is irradiated to pass therethrough, an EUV light concentrating mirror concentrating extreme ultraviolet light generated at the first point on a second point, a planar mirror arranged on an optical path of the extreme ultraviolet light reflected by the EUV light concentrating mirror and between the first and second points, an actuator causing the second point to be switched between a first position and a (Continued)

START

┌─ S10 ─┐
PERFORM ALIGNMENT ADJUSTMENT

┌─ S15 ─┐
CALIBRATION OF FIRST EUV MEASUREMENT UNIT

┌─ S30 ─┐
START GENERATION OF EUV LIGHT

┌─ S35 ─┐  ②
START TRANSMISSION OF EUV LIGHT TO EXTERNAL APPARATUS

┌─ S40 ─┐
RECEIVED EUV LIGHT NG SIGNAL FROM EXTERNAL APPARATUS?  YES

NO ┌─ S41 ─┐
YES CONTINUE TRANSMISSION OF EUV LIGHT TO EXTERNAL APPARATUS?

NO ┌─ S90 ─┐
TERMINATE GENERATION OF EUV LIGHT

END

┌─ S45 ─┐
STOP TRANSMISSION OF EUV LIGHT TO EXTERNAL APPARATUS

┌─ S50 ─┐
PERFORM TRANSMISSION OF EUV LIGHT TO FIRST EUV MEASUREMENT UNIT

① second position, a connection portion connectable to an external apparatus, a first EUV measurement unit on which the extreme ultraviolet light having passed through the second position is incident, and a processor controlling the actuator based on a signal from the external apparatus.

19 Claims, 17 Drawing Sheets

(56) References Cited

U.S. PATENT DOCUMENTS

| | | | |
|---|---|---|---|
| 2010/0284511 A1 | 11/2010 | Zocchi et al. | |
| 2010/0288937 A1 | 11/2010 | Watanabe et al. | |
| 2012/0156809 A1 | 6/2012 | Shirai | |
| 2016/0011056 A1* | 1/2016 | Liu | H01S 5/042 |
| | | | 250/338.1 |
| 2016/0225477 A1* | 8/2016 | Banine | G03F 7/70891 |

* cited by examiner

REFLECTANCE

BRAGG ANGLE θ [deg]

FIG. 11

CALIBRATION OF FIRST EUV MEASUREMENT UNIT

FIG. 20

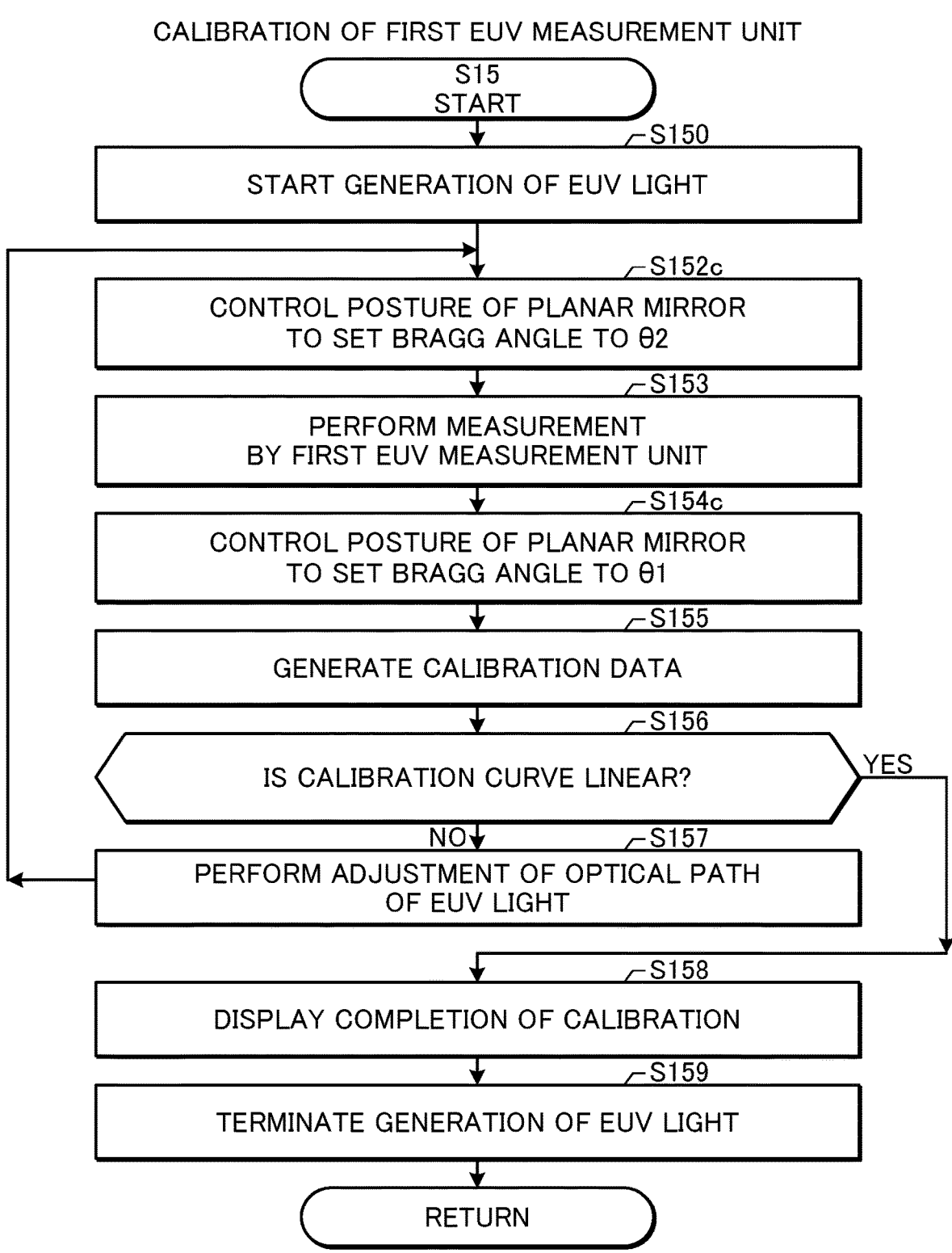

CALIBRATION OF FIRST EUV MEASUREMENT UNIT

S15
START

S150
START GENERATION OF EUV LIGHT

S152c
CONTROL POSTURE OF PLANAR MIRROR
TO SET BRAGG ANGLE TO θ2

S153
PERFORM MEASUREMENT
BY FIRST EUV MEASUREMENT UNIT

S154c
CONTROL POSTURE OF PLANAR MIRROR
TO SET BRAGG ANGLE TO θ1

S155
GENERATE CALIBRATION DATA

S156
IS CALIBRATION CURVE LINEAR?        YES

NO        S157
PERFORM ADJUSTMENT OF OPTICAL PATH
OF EUV LIGHT

S158
DISPLAY COMPLETION OF CALIBRATION

S159
TERMINATE GENERATION OF EUV LIGHT

RETURN

FIG. 23

EXTREME ULTRAVIOLET LIGHT GENERATION SYSTEM AND ELECTRONIC DEVICE MANUFACTURING METHOD

CROSS-REFERENCE TO RELATED APPLICATIONS

The present application claims the benefit of Japanese Patent Application No. 2021-188299, filed on Nov. 19, 2021, the entire contents of which are hereby incorporated by reference.

BACKGROUND

1. Technical Field

The present disclosure relates to an extreme ultraviolet light generation system and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, the development of an exposure apparatus that combines an extreme ultraviolet (EUV) light generation apparatus that generates EUV light having a wavelength of about 13 nm and reduced projection reflection optics is expected.

As the EUV light generation apparatus, a laser produced plasma (LPP) type apparatus using plasma generated by irradiating a target substance with pulse laser light has been developed.

LIST OF DOCUMENTS

Patent Documents

Patent Document 1: US Patent Application Publication No. 2010/288937
Patent Document 2: US Patent Application Publication No. 2010/140512
Patent Document 3: Japanese Patent Application Publication No. 2007-109451
Patent Document 4: US Patent Application Publication No. 2010/284511

SUMMARY

An extreme ultraviolet light generation system according to an aspect of the present disclosure includes a chamber; a target supply unit configured to supply a target substance to a plasma generation region including a first point in the chamber; a window configured to allow pulse laser light with which the target substance is irradiated to pass therethrough; an EUV light concentrating mirror configured to concentrate, on a second point, extreme ultraviolet light generated at the first point; a planar mirror arranged on an optical path of the extreme ultraviolet light reflected by the EUV light concentrating mirror and between the first and second points; an actuator configured to cause the second point to be switched between a first position and a second position by changing a posture of the planar mirror; a connection portion configured to be connectable to an external apparatus which the extreme ultraviolet light having passed through the first position enters; a first EUV measurement unit on which the extreme ultraviolet light having passed through the second position is incident; and a processor configured to control the actuator based on a signal from the external apparatus.

An electronic device manufacturing method according to an aspect of the present disclosure includes generating extreme ultraviolet light using an extreme ultraviolet light generation system, outputting the extreme ultraviolet light to an external apparatus which is an exposure apparatus, and exposing a photosensitive substrate to the extreme ultraviolet light in the exposure apparatus to manufacture an electronic device. Here, the extreme ultraviolet light generation system includes a chamber; a target supply unit configured to supply a target substance to a plasma generation region including a first point in the chamber; a window configured to allow pulse laser light with which the target substance is irradiated to pass therethrough; an EUV light concentrating mirror configured to concentrate, on a second point, the extreme ultraviolet light generated at the first point; a planar mirror arranged on an optical path of the extreme ultraviolet light reflected by the EUV light concentrating mirror and between the first and second points; an actuator configured to cause the second point to be switched between a first position and a second position by changing a posture of the planar mirror; a connection portion configured to be connectable to the external apparatus which the extreme ultraviolet light having passed through the first position enters; a first EUV measurement unit on which the extreme ultraviolet light having passed through the second position is incident; and a processor configured to control the actuator based on a signal from the external apparatus.

An electronic device manufacturing method according to an aspect of the present disclosure includes inspecting a defect of a mask by irradiating the mask with extreme ultraviolet light generated by an extreme ultraviolet light generation system, selecting a mask using a result of the inspection, and exposing and transferring a pattern formed on the selected mask onto a photosensitive substrate. Here, the extreme ultraviolet light generation system includes a chamber; a target supply unit configured to supply a target substance to a plasma generation region including a first point in the chamber; a window configured to allow pulse laser light with which the target substance is irradiated to pass therethrough; an EUV light concentrating mirror configured to concentrate, on a second point, the extreme ultraviolet light generated at the first point; a planar mirror arranged on an optical path of the extreme ultraviolet light reflected by the EUV light concentrating mirror and between the first and second points; an actuator configured to cause the second point to be switched between a first position and a second position by changing a posture of the planar mirror; a connection portion configured to be connectable to the external apparatus which the extreme ultraviolet light having passed through the first position enters, a first EUV measurement unit on which the extreme ultraviolet light having passed through the second position is incident; and a processor configured to control the actuator based on a signal from the external apparatus.

BRIEF DESCRIPTION OF THE DRAWINGS

Embodiments of the present disclosure will be described below merely as examples with reference to the accompanying drawings.

FIG. 11 shows the configuration for calibrating a first EUV measurement unit of the first embodiment.

FIG. 20 is a flowchart showing the detail of the operation of calibrating the first EUV measurement unit in the second embodiment.

FIG. 23 schematically shows the configuration of an exposure apparatus connected to the EUV light generation system.

DESCRIPTION OF EMBODIMENTS

Figure 1:
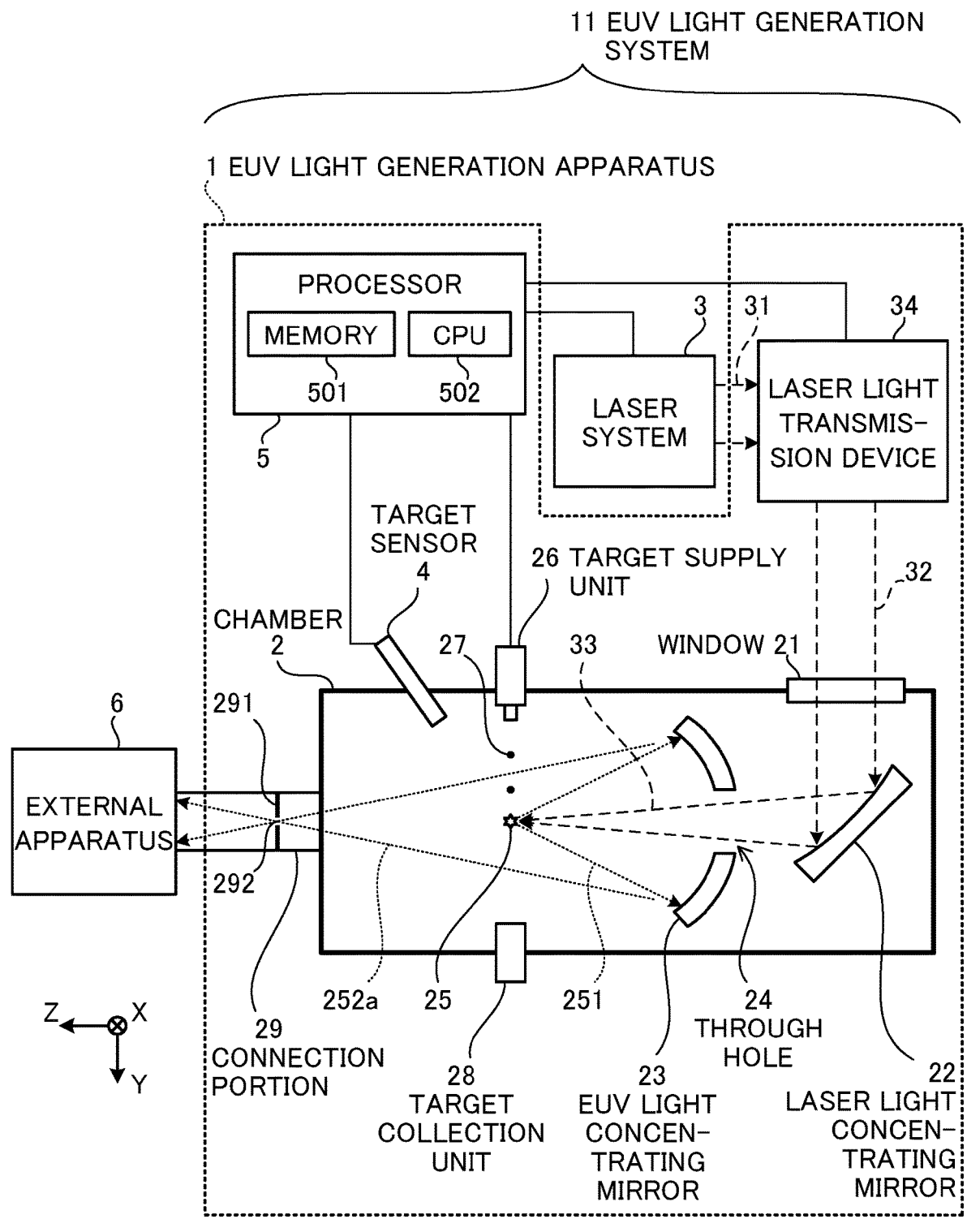
FIG. 1 schematically shows the configuration of an LPP EUV light generation system.

<Content>
1. Overall description of EUV light generation system 11
   1.1 Configuration
   1.2 Operation
2. Comparative example
   2.1 Configuration
   2.2 Operation
   2.3 Problems of comparative example 3. EUV light generation system 11b for measuring EUV light by first EUV measurement unit 60b
   3.1 Configuration
   3.2 Operation
      3.2.1 Operation of calibrating first EUV measurement unit 60b
      3.2.2 Operation of transmitting EUV light to external apparatus 6
      3.2.3 Operation in case that EUV light NG signal is received from external apparatus 6
         3.2.3.1 Case in which measurement result satisfies second condition
         3.2.3.2 Case in which measurement result does not satisfy second condition
      3.2.4 Detail of operation of calibrating first EUV measurement unit 60b
   3.3 Effect
4. EUV light generation system 11c with improved flexibility in arrangement of first EUV measurement unit 60b
   4.1 Configuration
   4.2 Operation
   4.3 Effect
5. EUV light generation system 11b capable of solving malfunction other than alignment
   5.1 Configuration and operation
   5.2 Effect
6. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 11

1.1 Configuration

FIG. 1 schematically shows the configuration of an LPP EUV light generation system 11. An EUV light generation apparatus 1 is used together with a laser system 3. In the present disclosure, a system including the EUV light generation apparatus 1 and the laser system 3 is referred to as the EUV light generation system 11. The EUV light generation apparatus 1 includes a chamber 2 and a target supply unit 26. The chamber 2 is a sealable container. The target supply unit 26 supplies a target 27 containing a target substance into the chamber 2. The material of the target substance may include tin, terbium, gadolinium, lithium, xenon, or a combination of any two or more thereof.

A through hole is formed in a wall of the chamber 2. The through hole is blocked by a window 21 through which pulse laser light 32 output from the laser system 3 passes. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24. The direction directing from the first focal point to the second focal point is represented by the Z direction. The travel direction of the target 27 perpendicular to the Z direction is represented by the Y direction. The direction perpendicular to both the Y direction and the Z direction is represented by the X direction.

The EUV light generation apparatus 1 includes a processor 5, a target sensor 4, and the like. The processor 5 is a processing device including a memory 501 in which a control program is stored and a central processing unit (CPU) 502 which executes the control program. The processor 5 is specifically configured or programmed to perform various processes included in the present disclosure. The target sensor 4 detects at least one of the presence, trajectory, position, and velocity of the target 27. The target sensor 4 may have an imaging function.

Further, the EUV light generation apparatus 1 includes a connection portion 29 providing communication between the inside of the chamber 2 and the inside of an external apparatus 6. Examples of the external apparatus 6 will be described later with reference to FIGS. 23 and 24. A wall 291 in which an aperture is formed is arranged in the connection portion 29. The wall 291 is arranged so as the aperture is located at the second focal point of the EUV light concentrating mirror 23.

Further, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element.

1.2 Operation

Operation of the EUV light generation system 11 will be described with reference to FIG. 1. Pulse laser light 31 output from the laser system 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as the pulse laser light 33.

The target supply unit 26 outputs the target 27 toward the plasma generation region 25 in the chamber 2. The target 27 is irradiated with the pulse laser light 33. The target 27 irradiated with the pulse laser light 33 is turned into plasma, and radiation light 251 is radiated from the plasma. EUV light included in the radiation light 251 is reflected by the EUV light concentrating mirror 23 with higher reflectance than light in other wavelength ranges. EUV light 252a reflected by the EUV light concentrating mirror 23 is concentrated at the intermediate focal point 292 and output to the external apparatus 6. Here, one target 27 may be irradiated with a plurality of pulses included in the pulse laser light 33.

The processor 5 controls the entire EUV light generation system 11. The processor 5 processes the detection result of the target sensor 4. Based on the detection result of the target sensor 4, the processor 5 controls the timing at which the target 27 is output, the output direction of the target 27, and the like. Further, the processor 5 controls the oscillation timing of the laser system 3, the travel direction of the pulse laser light 32, the concentration position of the pulse laser light 33, and the like. Such various kinds of control described above are merely exemplary, and other control may be added as necessary.

2. Comparative Example

2.1 Configuration

Figure 2:
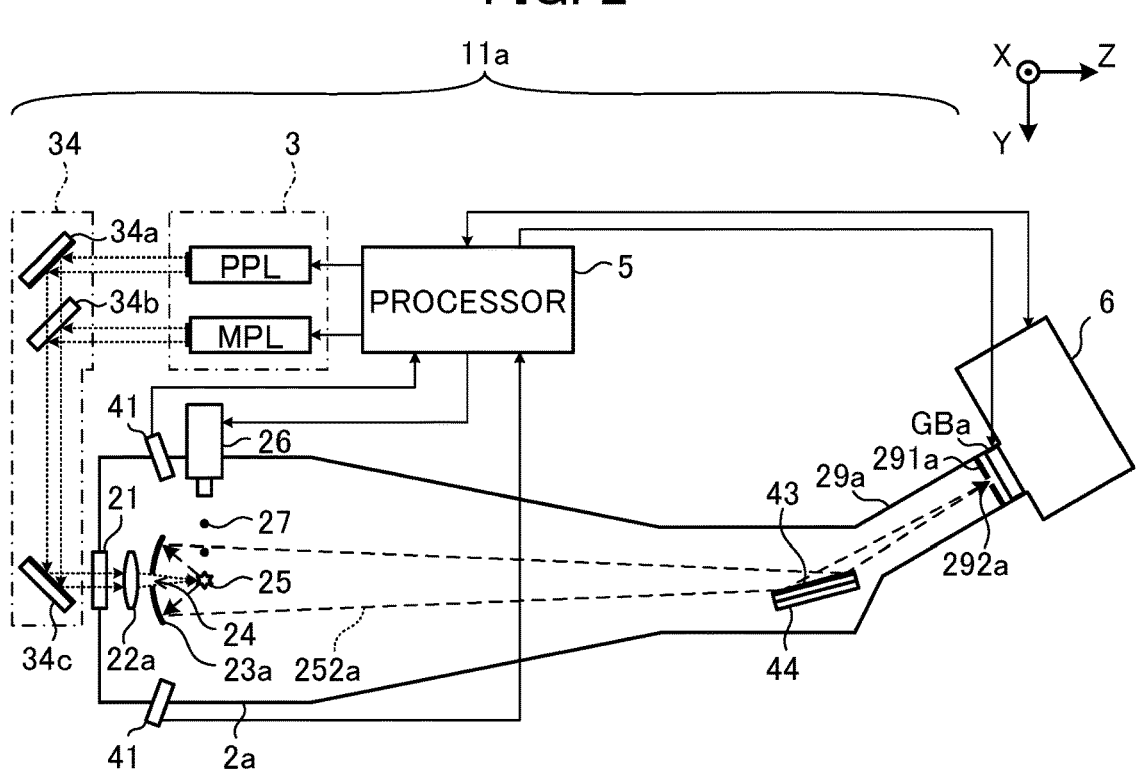
FIG. 2 schematically shows the configuration of the EUV light generation system according to a comparative example.

FIG. 2 schematically shows the configuration of an EUV light generation system 11a according to a comparative example. The comparative example of the present disclosure is an example recognized by the applicant as known only by the applicant, and is not a publicly known example admitted by the applicant. As shown in FIG. 2, the EUV light generation system 11a according to the comparative example includes a chamber 2a instead of the chamber 2, and a connection portion 29a instead of the connection portion 29. The laser system 3 includes a prepulse laser device PPL and a main pulse laser device MPL.

The laser light transmission device 34 includes high reflection mirrors 34a, 34c, and a beam combiner 34b. The high reflection mirror 34a is arranged on an optical path of the prepulse laser light output from the prepulse laser device PPL. The beam combiner 34b is arranged at a position where the optical path of the main pulse laser light output from the main pulse laser device MPL and the optical path of the prepulse laser light reflected by the high reflection mirror 34a overlap. The high reflection mirror 34c is arranged on the common optical path of the main pulse laser light reflected by the beam combiner 34b and the prepulse laser light transmitted through the beam combiner 34b.

In the chamber 2a, a laser light concentrating optical system 22a is arranged instead of the laser light concentrating mirror 22, and an EUV light concentrating mirror 23a is arranged instead of the EUV light concentrating mirror 23. The EUV light concentrating mirror 23a is configured to reflect the EUV light generated at the first focal point located in the plasma generation region 25 inside the chamber 2a and concentrate the EUV light on a second point 292a. The first focal point of the EUV light concentrating mirror 23a corresponds to the first point in the present disclosure.

A planar mirror 43 is further accommodated in the chamber 2a. The planar mirror 43 is located between the first focal point of the EUV light concentrating mirror 23a and the second point 292a on the optical path of the EUV light 252a reflected by the EUV light concentrating mirror 23a. The planar mirror 43 is supported by a holder 44.

A multilayer reflection film of molybdenum and silicon is formed on the surface of the EUV light concentrating mirror 23a, whereas a reflection film of ruthenium is formed on the surface of the planar mirror 43.

Figure 3:
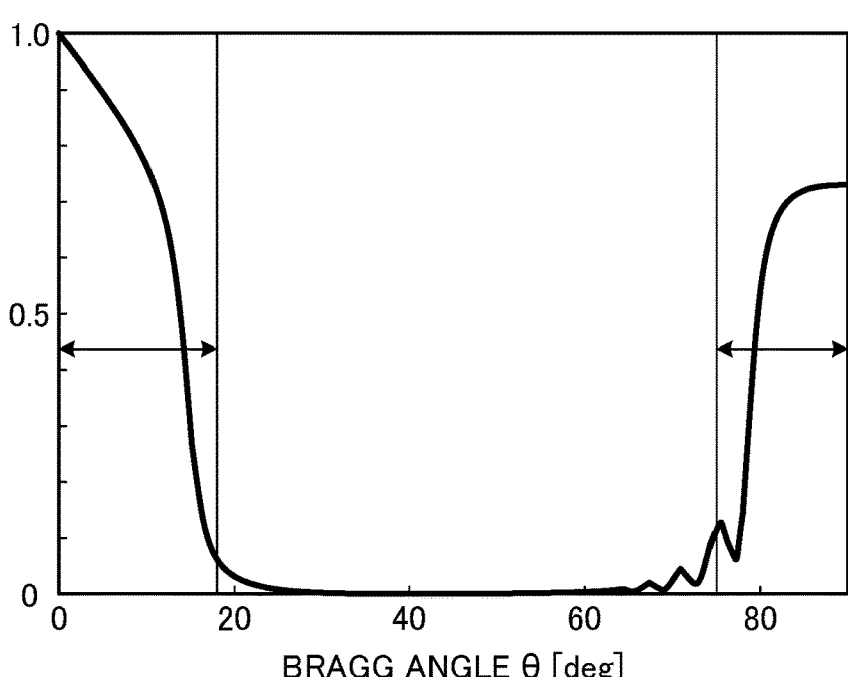
FIG. 3 is a graph showing the reflectance of EUV light by an EUV light concentrating mirror.
Figure 4:
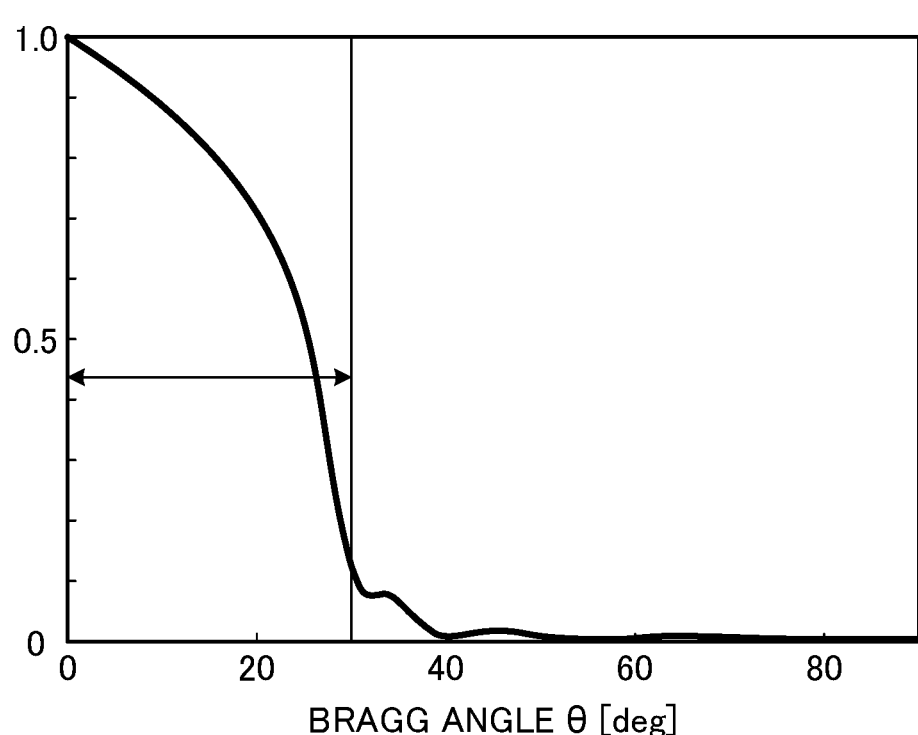
FIG. 4 is a graph showing the reflectance of EUV light by a planar mirror.
Figure 5:
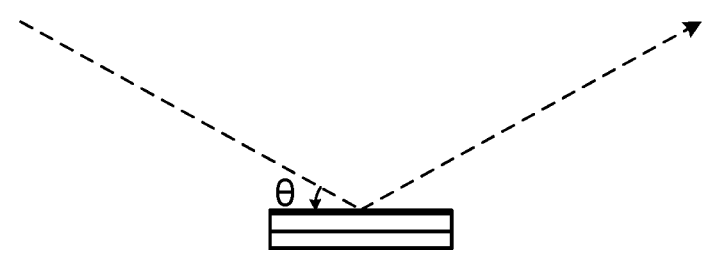
FIG. 5 shows the definition of the Bragg angle.

FIG. 3 is a graph showing the reflectance of EUV light by the EUV light concentrating mirror 23a, and FIG. 4 is a graph showing the reflectance of EUV light by the planar mirror 43. The horizontal axis of each of FIGS. 3 and 4 represents the Bragg angle $\theta$. FIG. 5 shows the definitions of the Bragg angle $\theta$. The Bragg angle $\theta$ in the present disclosure is an angle between the reflection surface of a mirror and the optical path axis of EUV light. The optical path axis means the center axis of an optical path. In both FIGS. 3 and 4, high reflectance is shown for grazing incidence where the Bragg angle $\theta$ is close to 0°, but the reflectance rapidly decreases as the Bragg angle $\theta$ increases. In FIG. 3, when the Bragg angle $\theta$ is close to 90°, the reflectance of about 70% can be obtained due to interference in the multilayer film.

Therefore, the EUV light concentrating mirror 23a is arranged such that the Bragg angle $\theta$ of the light emitted from the plasma generation region 25 is 74° or more and 90° or less. The planar mirror 43 is arranged such that the Bragg angle θ of the EUV light 252a reflected by the EUV light concentrating mirror 23a is more than 0° and 30° or less.

However, the present disclosure is not limited thereto, and a multilayer reflection film of molybdenum and silicon may be formed on the planar mirror 43. In that case, the planar mirror 43 is arranged such that the Bragg angle θ is more than 0° and 18° or less.

Referring again to FIG. 2, a plurality of EUV light detection sensors 41 are attached to the chamber 2a. The EUV light detection sensors 41 are configured to observe the plasma generation region 25 from a plurality of directions and detect the intensity distribution of the EUV light.

The target supply unit 26 and the EUV light concentrating mirror 23a are each configured to be movable by a moving stage (not shown). Optical elements such as the high reflection mirror 34c included in the laser light transmission device 34 are configured such that the postures thereof are controllable by actuators (not shown).

The chamber 2a is configured to be connectable to the external apparatus 6 via the connection portion 29a. A gate valve GBa and a wall 291a in which an aperture is formed are arranged in the connection portion 29a. The wall 291a is arranged such that the aperture is located at the second point 292a.

2.2 Operation

The optical path of the prepulse laser light output from the prepulse laser device PPL and the optical path of the main pulse laser output from the main pulse laser device MPL are substantially matched by the beam combiner 34b. The droplet target 27 is irradiated with the prepulse laser light and the target 27 is dispersed. The target 27 irradiated with the prepulse laser light and dispersed is irradiated with the main pulse laser light and turned into plasma. The EUV light 252a among the light emitted from the plasma is reflected by the EUV light concentrating mirror 23a.

The EUV light 252a is reflected by the planar mirror 43 and enters the external apparatus 6 after passing through the second point 292a in the connection portion 29a.

The processor 5 calculates the centroid position of the EUV light generated in the plasma generation region 25 from the intensity distribution of the EUV light detected by the EUV light detection sensors 41, and controls, based on the centroid position, the position of the EUV light concentrating mirror 23a, the position of the target supply unit 26, and the generation timings of the prepulse laser light and the main pulse laser light. The processor 5 controls the posture of the optical elements included in the laser light transmission device 34 so that the target 27 is irradiated with prepulse laser light and the main pulse laser light.

The position of the first focal point is changed by moving the EUV light concentrating mirror 23a. Since the trajectory of the target 27 changes when the target supply unit 26 is moved, the centroid position in the X direction and the Z direction of the EUV light generated in the plasma generation region 25 changes. Further, when the generation timings of the prepulse laser light and the main pulse laser light change, the position on the trajectory at which the target 27 is irradiated with the laser light changes, so that the centroid position in the Y direction of the EUV light generated in the plasma generation region 25 changes.

The external apparatus 6 is an apparatus for performing exposure of a semiconductor wafer or inspection of a mask using EUV light, and performs exposure or inspection while measuring whether the EUV light satisfies a required condition. The condition is determined by the external apparatus 6, and corresponds to the first condition in the present disclosure. The first condition includes, for example, the pulse energy of the EUV light, the centroid position and the spot size of the light intensity distribution of the cross section perpendicular to the optical path axis of the EUV light. When the EUV light does not satisfy the first condition, the external apparatus 6 transmits an EUV light NG signal to the processor 5. Upon receiving the EUV light NG signal from the external apparatus 6, the processor 5 stops the transmission of the EUV light to the external apparatus 6.

2.3 Problems of Comparative Example

When the EUV light in the external apparatus 6 does not satisfy the first condition, it may be necessary to disconnect the EUV light generation system 11a and the external apparatus 6 to determine whether the cause is in EUV light generation system 11a or in the external apparatus 6. Once the EUV light generation system 11a and the external apparatus 6 are disconnected from each other, a process of reconnecting the EUV light generation system 11a to the external apparatus 6 and restarting the EUV light generation system 11a is required, which increases downtime.

Further, the EUV light generation system 11a cannot detect a change in the profile of the EUV light 252a at the second point 292a. That is, unless the EUV light NG signal is received from the external apparatus 6, the presence or absence of abnormality of the EUV light 252a at the second point 292a cannot be determined. Therefore, there may be a case that appropriate control of the EUV light generation system 11a is difficult.

In some embodiments described below, the posture of the planar mirror 43 is changed to allow measurement of the EUV light 252a at a second point 292b using a first EUV measurement unit 60b.

3. EUV Light Generation System 11b for Measuring EUV Light by First EUV Measurement Unit 60b

3.1 Configuration

Figure 6:
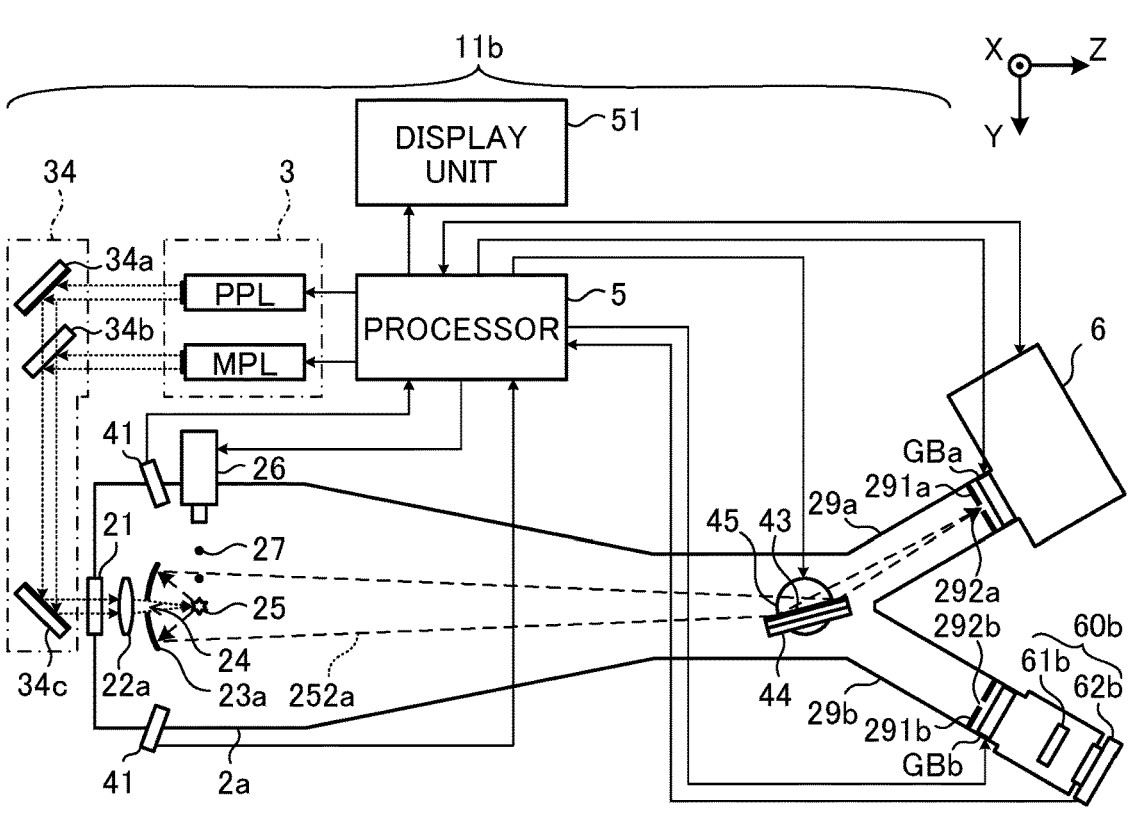
FIG. 6 schematically shows the configuration of the EUV light generation system according to a first embodiment.
Figure 7:
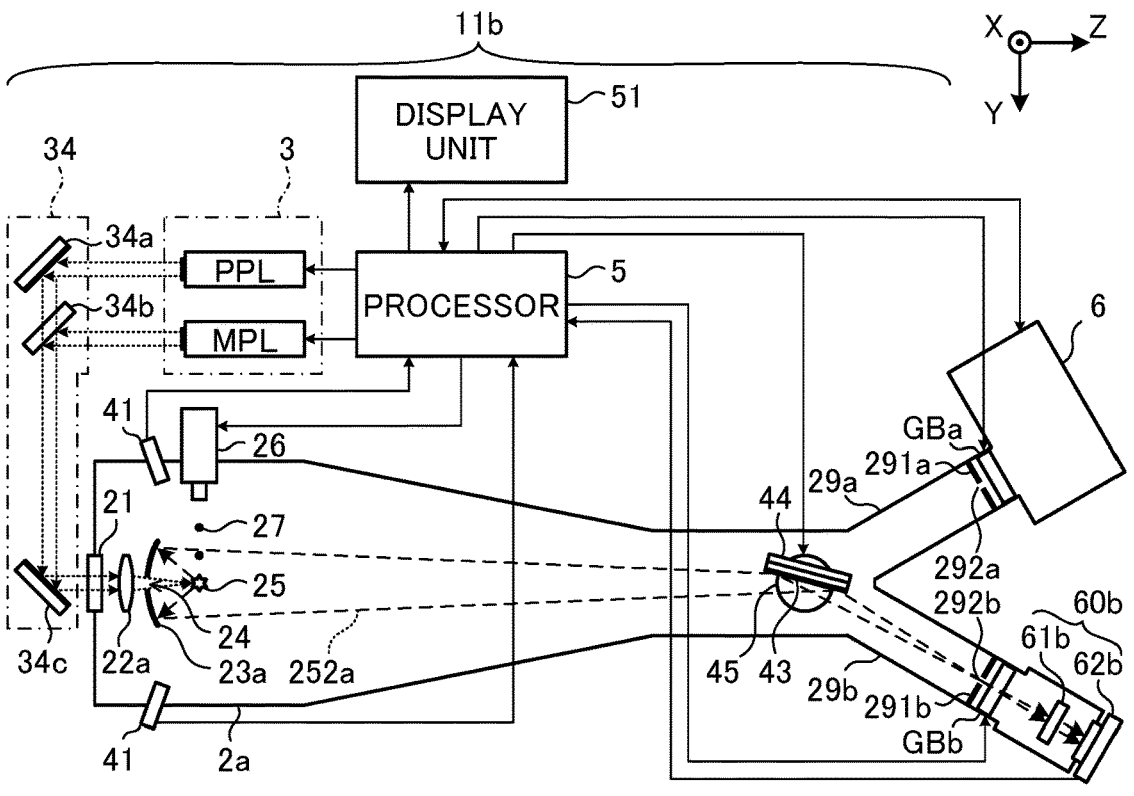
FIG. 7 schematically shows the configuration of the EUV light generation system according to the first embodiment.

FIGS. 6 and 7 schematically show the configuration of an EUV light generation system 11b according to a first embodiment. The EUV light generation system 11b includes a connection portion 29b, an actuator 45, a first EUV measurement unit 60b, and a display unit 51, in addition to the configuration shown in FIG. 2.

The actuator 45 is a rotary stage capable of changing the posture of the planar mirror 43 supported by the holder 44. The actuator 45 rotates the planar mirror 43 about an axis parallel to the X direction. The X direction is perpendicular to a first virtual plane including the first focal point of the EUV light concentrating mirror 23a and the second points 292a, 292b. By changing the posture of the planar mirror 43 by the actuator 45, the position at which the EUV light 252a is concentrated by the EUV light concentrating mirror 23a can be moved from the second point 292a to the second point 292b being at another position. In the present disclosure, the position of the second point 292a is the first position, and the position of the second point 292b is the second position. The second points 292a, 292b are in mirror image relationship across a second virtual plane parallel to the XZ plane and passing through the plasma generation region 25. The first virtual plane including the first focal point of the EUV light concentrating mirror 23a and the second points 292a, 292b is parallel to the YZ plane, and the optical path of the EUV light 252a from EUV light concentrating mirror 23a to the second point 292a and the optical path of the EUV light 252a from the EUV light concentrating mirror 23a to the second point 292b are located on the first virtual plane.

The first EUV measurement unit 60b is located on the optical path of the EUV light 252a having passed through the second point 292b. The first EUV measurement unit 60b includes a fluorescent plate 61b and an image sensor 62b. The fluorescent plate 61b includes an YAG: Ce (cerium-doped yttrium aluminum garnet) crystal that generates visible light in response to EUV light.

The chamber 2a is connected to the first EUV measurement unit 60b via the connection portion 29b. The connection portion 29a and the connection portion 29b are arranged at positions in mirror image relationship across the second virtual plane. A gate valve GBb and a wall 291b in which an aperture is formed are arranged in the connection portion 29b. The wall 291b is arranged such that the aperture is located at the second point 292b.

The display unit 51 is a device for displaying the measurement result and the like of the first EUV measurement unit 60b, and may be an image display device, or a display lamp.

Figure 8:
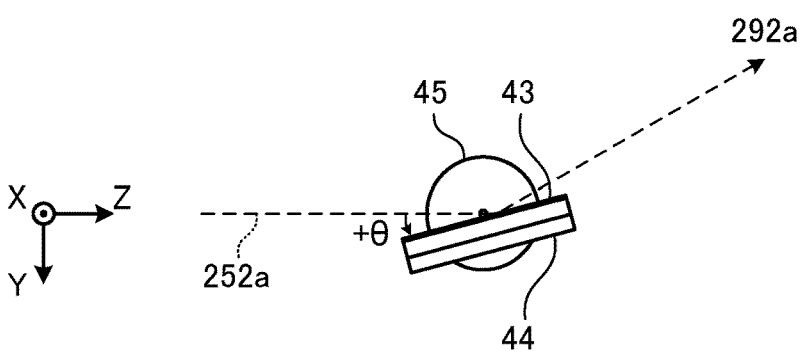
FIG. 8 is an enlarged view of a planar mirror, a holder, and an actuator shown in FIG. 6.
Figure 9:
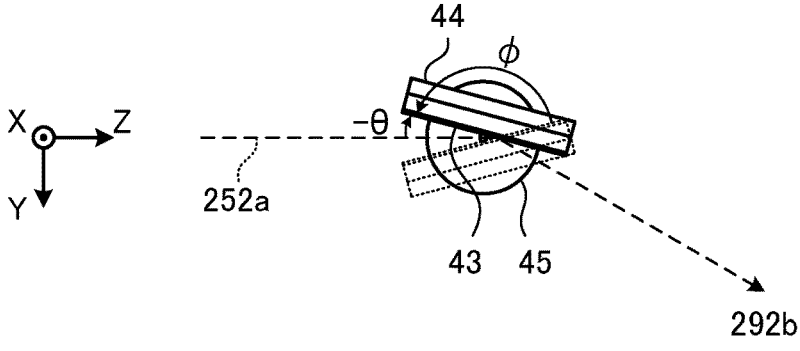
FIG. 9 is an enlarged view of the planar mirror, the holder, and the actuator shown in FIG. 7.
Figure 10:
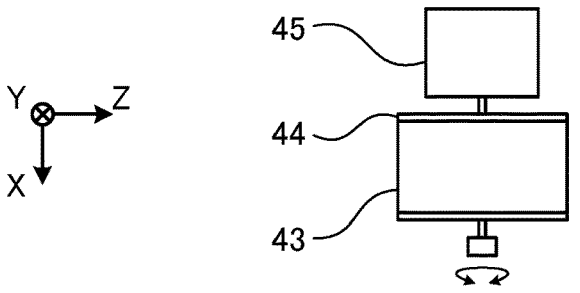
FIG. 10 shows the planar mirror, the holder, and the actuator shown in FIG. 8 from another direction.

FIGS. 8 and 9 are enlarged views of the planar mirror 43, the holder 44, and the actuator 45 shown in FIGS. 6 and 7, respectively. FIG. 10 shows the planar mirror 43, the holder 44, and the actuator 45 shown in FIG. 8 from another direction. A drive shaft of the actuator 45 is connected to the holder 44 of the planar mirror 43.

As shown in FIG. 8, the Bragg angle between the planar mirror 43 and the EUV light 252a when the EUV light 252a is reflected toward the second point 292a is represented by $+\theta$. As shown in FIG. 9, the Bragg angle between the planar mirror 43 and the EUV light 252a when the EUV light 252a is reflected toward the second point 292b is represented by $-\theta$ with the planar mirror 43 inclined by the same degrees as but in a different direction from the case of FIG. 8. The Bragg angles $+\theta$, $-\theta$ are equal in absolute value, and the reflectance shown in FIG. 4 becomes the same in the cases of FIGS. 8 and 9. The Bragg angles $+\theta$, $-\theta$ are examples of the first and second Bragg angles in the present disclosure, respectively.

In order to rotate the planar mirror 43 from the posture in which the Bragg angle is $+\theta$ to the posture in which the Bragg angle is $-\theta$, rotation by an angle $\varphi$ is performed as shown in FIG. 9. In this case, the planar mirror 43 rotates while the reflection surface of the planar mirror 43 is positioned in the optical path of the EUV light 252a.

Figure 11:
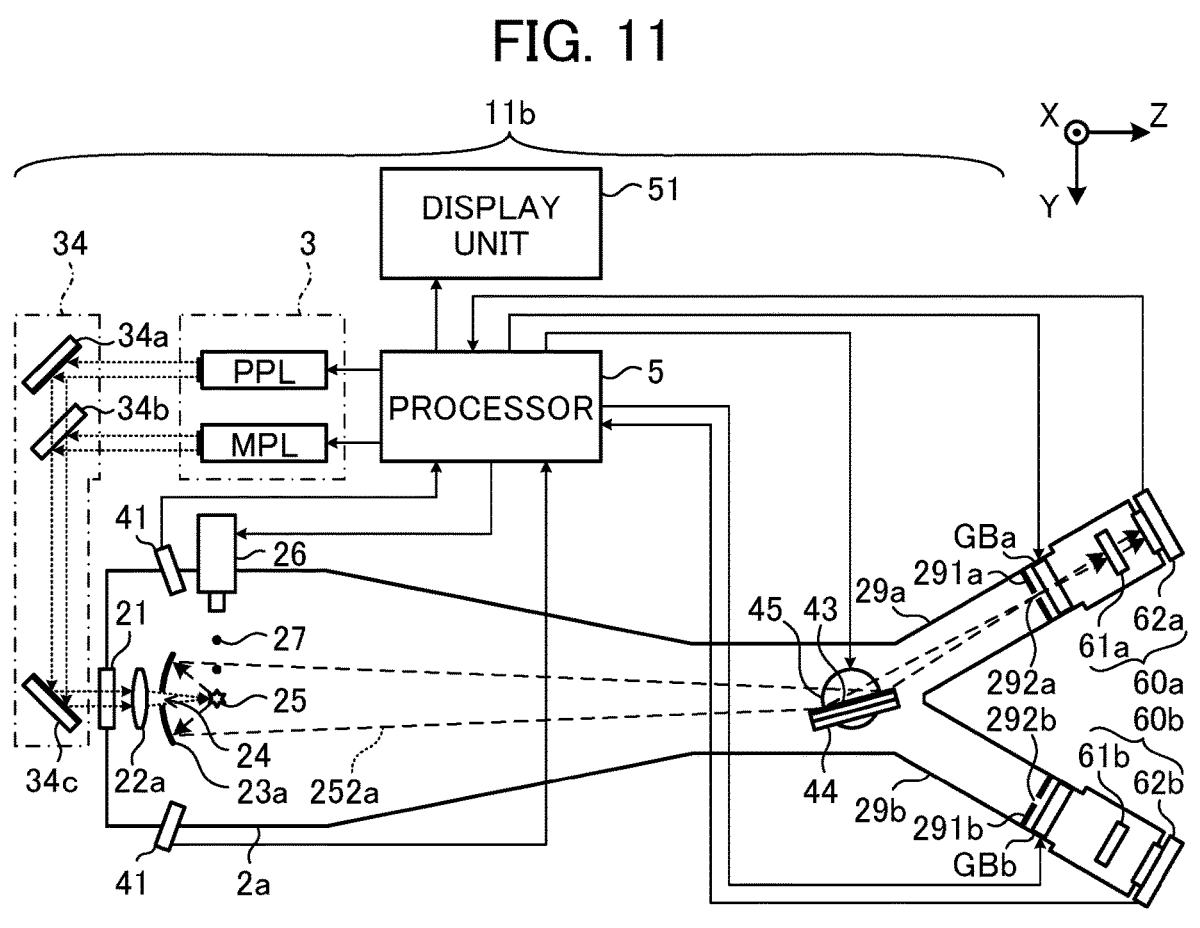

FIG. 11 shows the configuration for calibrating the first EUV measurement unit 60b of the first embodiment. Before connecting the external apparatus 6 to the connection portion 29a, in order to calibrate the first EUV measurement unit 60b, it is possible to connect a second EUV measurement unit 60a to the connection portion 29a. Alternatively, the external apparatus 6 may be removed from the connection portion 29a to connect the second EUV measurement unit 60a.

The second EUV measurement unit 60a includes a fluorescent plate 61a and an image sensor 62a. The configuration thereof may be the same as those included in the first EUV measurement unit 60b.

3.2 Operation

Figure 12:
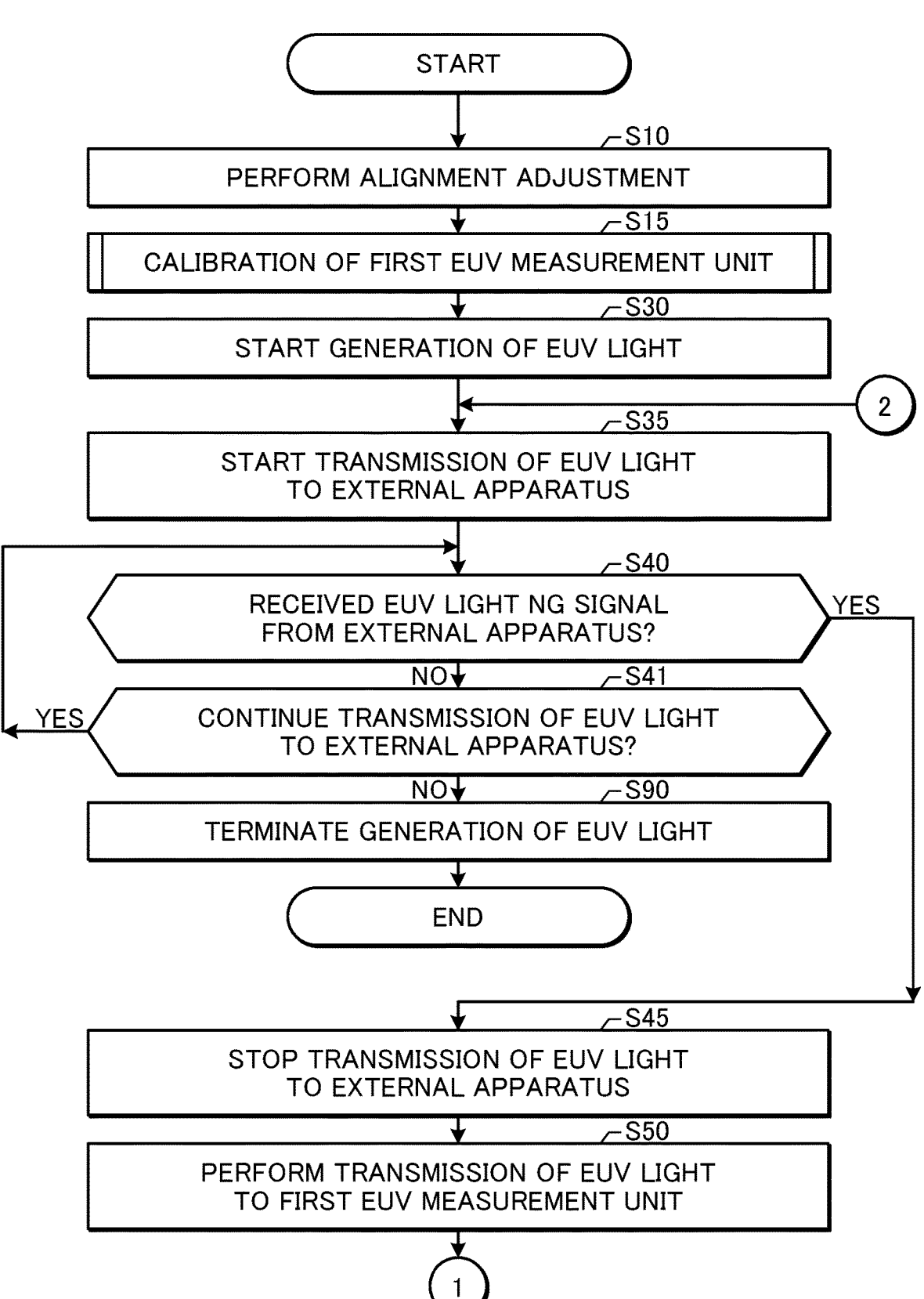
FIG. 12 is a flowchart showing operation of a processor in the first embodiment.
Figure 13:
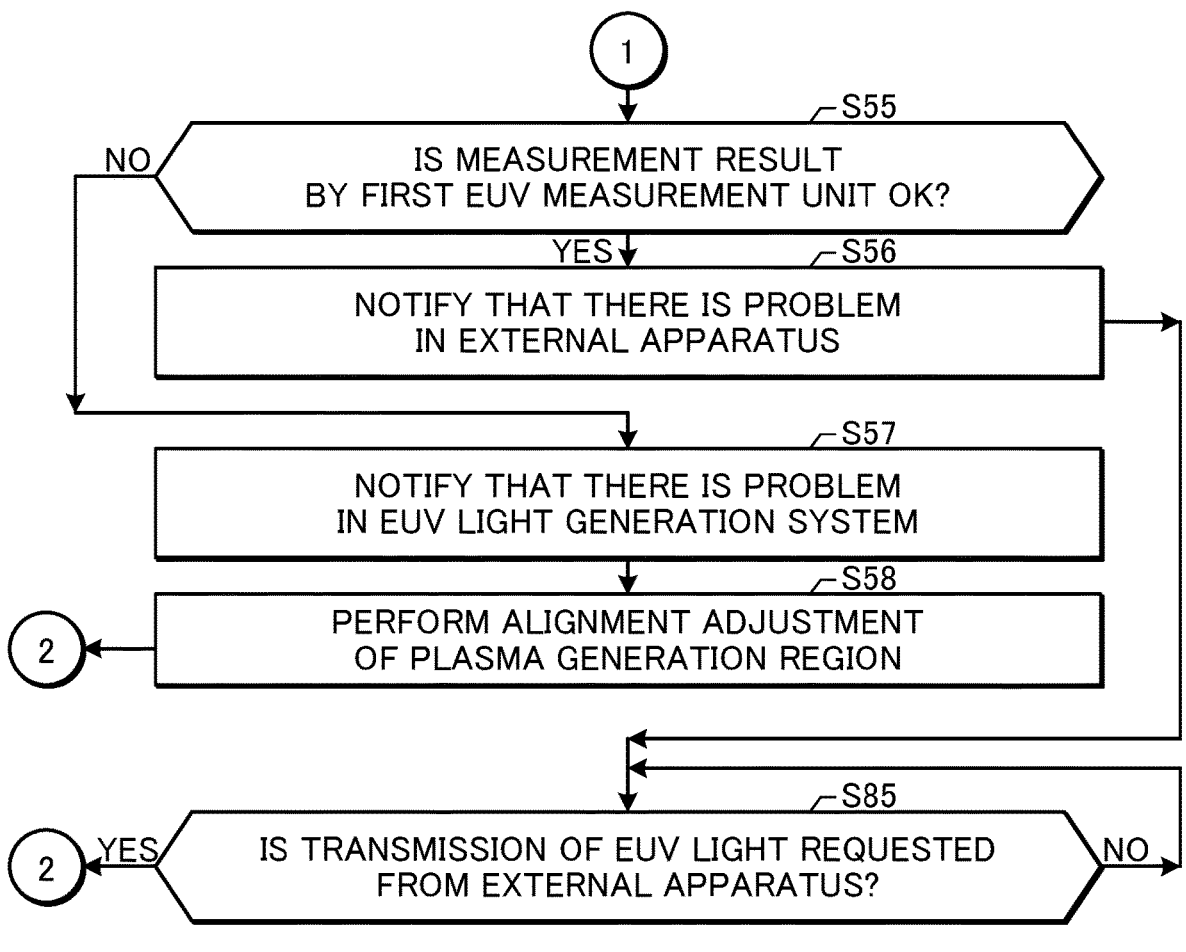
FIG. 13 is a flowchart showing operation of the processor in the first embodiment.

FIGS. 12 and 13 are flowcharts showing the operation of the processor 5 in the first embodiment. Processing shown in FIGS. 12 and 13 includes operation of calibrating the first EUV measurement unit 60b, operation of transmitting the EUV light to the external apparatus 6, and operation when the EUV light NG signal is received from the external apparatus 6.

3.2.1 Operation of Calibrating First EUV Measurement Unit 60b

First, in a state in which the external apparatus 6 is not connected to the connection portion 29a, the second EUV measurement unit 60a is connected to the connection portion 29a as shown in FIG. 11.

Then, in S10, the processor 5 performs alignment adjustment of the EUV light generation system 11b. Specifically, the following control is performed.

The Bragg angle between the planar mirror 43 and the EUV light 252a is set to $+\theta$, as shown in FIG. 8.

Generation of the EUV light is started, and the gate valve GBa is opened.

The alignment adjustment is performed so that the EUV light measured by the second EUV measurement unit 60a satisfies a predetermined condition. This alignment adjustment includes alignment adjustment of the EUV light concentrating mirror 23a, the planar mirror 43, the target supply unit 26, the prepulse laser device PPL, the main pulse laser device MPL, and the laser light transmission device 34. The alignment adjustment further includes adjustment of the generation timings of the prepulse laser light and the main pulse laser light. The predetermined condition to be satisfied by the EUV light includes, for example, the pulse energy of the EUV light, the centroid position of the light intensity distribution measured by the second EUV measurement unit 60a, and the spot size of the cross section perpendicular to the optical path axis of the EUV light.

Then, the gate valve GBa is closed to terminate the generation of the EUV light.

In S15, the processor 5 calibrates the first EUV measurement unit 60b. Details of this processing will be described later with reference to FIGS. 14 and 15. Here, when the second EUV measurement unit 60a, which has measured the EUV light in S10, is removed and connected to the connection portion 29b and used as the first EUV measurement unit 60b, processing of S15 may not be performed.

3.2.2 Operation of Transmitting EUV Light to External Apparatus 6

After S15, the second EUV measurement unit 29a is removed from the connection portion 29a, and the external apparatus 6 is connected to the connection portion 29a as shown in FIG. 6.

Then, in S30, the processor 5 controls the EUV light generation system 11b to start the generation of the EUV light.

In S35, the processor 5 opens the gate valve GBa to start transmission of the EUV light to the external apparatus 6. At this time, the Bragg angle between the planar mirror 43 and the EUV light 252a is $+\theta$.

In S40, the processor 5 determines whether or not the EUV light NG signal has been received from the external apparatus 6. The EUV light NG signal is a signal output from the external apparatus 6 when the external apparatus 6 determines that the measurement result of the EUV light at the external apparatus does not satisfy the first condition.

When the EUV light NG signal has not been received (S40: NO), the processor 5 proceeds processing to S41. In S41, the processor 5 determines whether or not to continue the transmission of the EUV light to the external apparatus 6. When the transmission of the EUV light to the external apparatus 6 is to be continued (S41: YES), the processor 5 returns to S40. When the transmission of the EUV light to the external apparatus 6 is not to be continued (S41: NO), the processor 5 proceeds to S90. In S90, the processor 5 closes the gate valve GBa to terminate the generation of the EUV light. After S90, the processor 5 ends processing of the flowchart.

3.2.3 Operation in Case that EUV Light NG Signal is Received from External Apparatus 6

When the EUV light NG signal has been received (S40: YES), the processor 5 proceeds to S45.

In S45, the processor 5 closes the gate valve GBa to stop the transmission of the EUV light to the external apparatus 6.

In S50, the processor 5 sets the Bragg angle between the planar mirror 43 and the EUV light 252a to −θ to reflect the EUV light 252a toward the second point 292b, and starts the transmission of the EUV light to the first EUV measurement unit 60b by opening the gate valve GBb.

Referring to FIG. 13, in S55, it is determined whether or not the measurement result of the EUV light by the first EUV measurement unit 60b satisfies a second condition. The second condition may be a condition equivalent to the first condition, or may include a more severe condition in addition to satisfying the first condition.

According to the determination result of S55, processing next branches to S56 and S57.

3.2.3.1 Case in which Measurement Result Satisfies Second Condition

When the measurement result of the EUV light by the first EUV measurement unit 60b satisfies the second condition (S55: YES), the processor 5 proceeds to S56.

In S56, the processor 5 notifies the external apparatus 6 that there is a problem in the external apparatus 6 and causes the display unit 51 to display the determination result. This is because there is no problem in the EUV light generation system 11b when the measurement result satisfies the second condition. In this case, adjustment of the external apparatus 6 is performed.

In S85, the processor 5 waits until the transmission of the EUV light is requested from the external apparatus 6. When the waiting time is short, the generation of the EUV light may not be terminated. However, the gate valve GBa is kept closed so as not to output the EUV light to the external apparatus 6. The Bragg angle between the planar mirror 43 and the EUV light 252a may be set to +θ. When the transmission of the EUV light is requested from the external apparatus 6 (S85: YES), the processor 5 returns to S35 of FIG. 12.

3.2.3.2 Case in which Measurement Result does not Satisfy Second Condition

When the measurement result of the EUV light by the first EUV measurement unit 60b does not satisfy the second condition (S55: NO), the processor 5 proceeds to S57.

In S57, the processor 5 notifies the external apparatus 6 that there is a problem in the EUV light generation system 11b and causes the display unit 51 to display the determination result.

In S58, the processor 5 performs the alignment adjustment of the plasma generation region 25. The alignment adjustment of the plasma generation region 25 includes position adjustment of the target supply unit 26 and the adjustment of the generation timings of the prepulse laser light and the main pulse laser light. The alignment adjustment of the EUV light concentrating mirror 23a may be performed together with the alignment adjustment of the plasma generation region 25. During the alignment adjustment of the plasma generation region 25, the generation of the EUV light is not terminated, but the gate valve GBa is kept closed.

After S58, the processor 5 sets the Bragg angle between the planar mirror 43 and the EUV light 252a to +0, and returns to S35 of FIG. 12.

3.2.4 Detail of Operation of Calibrating First EUV Measurement Unit 60b

Figure 14:
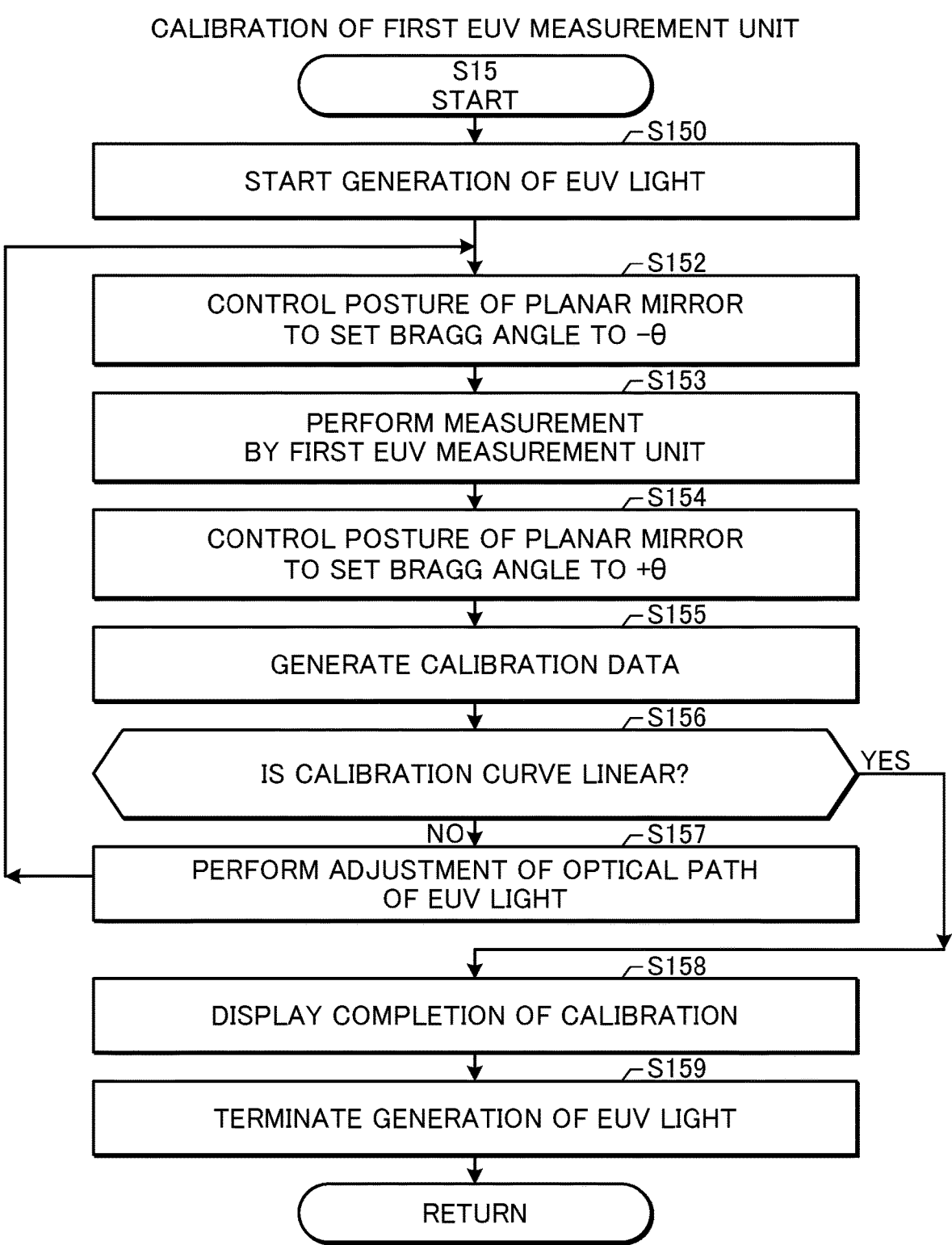
FIG. 14 is a flowchart showing the detail of the operation of calibrating the first EUV measurement unit in the first embodiment.

FIG. 14 is a flowchart showing the detail of the operation of calibrating the first EUV measurement unit 60b in the first embodiment. The processing shown in FIG. 14 corresponds to the subroutine of S15 in FIG. 12.

In S150, the processor 5 controls the EUV light generation system 11b to start the generation of the EUV light.

In S152, the processor 5 sets the Bragg angle between the planar mirror 43 and the EUV light 252a to −θ.

In S153, the processor 5 opens the gate valve GBb and causes the first EUV measurement unit 60b to measure the EUV light. Then, the processor 5 closes the gate valve GBb.

In S154, the processor 5 sets the Bragg angle between the planar mirror 43 and the EUV light 252a to +θ. At this time, the gate valve GBa may be opened to cause the second EUV measurement unit 60a to measure the EUV light, but when the measurement result in S10 of FIG. 12 can be used, it is not necessary to perform the measurement by the second EUV measurement unit 60a again.

In S155, the processor 5 generates calibration data from the measurement results of the first and second EUV measurement units 60b, 60a.

Figure 15:
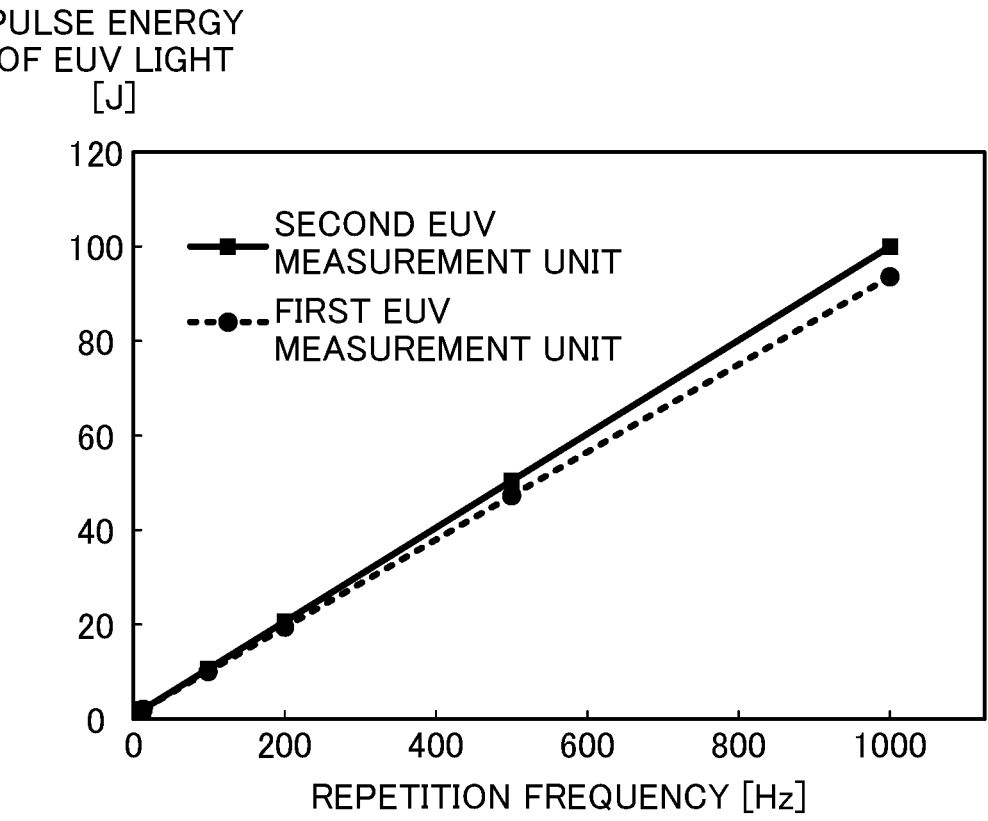
FIG. 15 is a graph showing an example of calibration curves included in the calibration data.

FIG. 15 is a graph showing an example of calibration curves included in the calibration data. In FIG. 15, the horizontal axis represents the repetition frequency, and the vertical axis represents the pulse energy of the EUV light. The horizontal axis is not limited to the repetition frequency, and may be the gas pressure in the chamber 2a or the light intensity of the prepulse laser light or the main pulse laser light. The first and second EUV measurement units 60b, 60a receive the EUV light 252a reflected by the planar mirror 43 with the same reflectance. However, the measurement results of the first and second EUV measurement units 60b, 60a may be different due to the characteristic difference between the first and second EUV measurement units 60b, 60a. When the calibration curve is linear, a value that does not depend on the characteristic difference between the first and second EUV measurement units 60b, 60b can be calculated by multiplying the measurement value of the first EUV measurement unit 60a by a correction coefficient. The calibration data generated by the processor 5 also includes such a correction coefficient.

Referring again to FIG. 14, in S156, the processor 5 determines whether or not the calibration curve is linear.

When the calibration curve is not linear (S156: NO), the processor 5 proceeds to S157.

In S157, the processor 5 performs adjustment of the optical path of the EUV light 252a by performing position adjustment of the EUV light concentrating mirror 23a or another optical element. A possible cause of a non-linear calibration curve is, for example, that the EUV light 252a passes through a position shifted from the center of the aperture of the wall 291b. The calibration curve may be improved by adjusting the optical path of the EUV light 252a.

After S157, the processor 5 returns to S152.

When the calibration curve is linear (S156: YES), the processor 5 proceeds to S158.

In S158, the processor 5 causes the display unit 51 to display completion of the calibration of the first EUV measurement unit 60b.

In S159, the processor 5 terminates the generation of the EUV light. After S159, the processor 5 ends processing of the flowchart and returns to processing shown in FIG. 12.

3.3 Effect (1) According to the first embodiment, the EUV light generation system 11*b* includes the chamber 2*a*, the target supply unit 26, the window 21, the EUV light concentrating mirror 23*a*, the planar mirror 43, the actuator 45, the connection portion 29*a*, the first EUV measurement unit 60*b*, and the processor 5. The target supply unit 26 supplies the target 27 to the plasma generation region 25 including the first focal point of the EUV light concentrating mirror 23*a*. The window 21 allows the pulse laser light with which the target 27 is irradiated to pass therethrough. The EUV light concentrating mirror 23*a* reflects the EUV light generated at the first focal point and concentrates the EUV light on the second point 292*a* or 292*b*. The planar mirror 43 is arranged between the first focal point and the second point 292*a* or 292*b* on the optical path of the EUV light 252*a* reflected by the EUV light concentrating mirror 23*a*. The actuator 45 changes the posture of the planar mirror 43 to perform switching between the second points 292*a*, 292*b*. The connection portion 29*a* is configured to be connectable to the external apparatus 6 which the EUV light 252*a* having passed through the second point 292*a* enters. The EUV light 252*a* having passed through the second point 292*b* is incident on the first EUV measurement unit 60*b*. The processor 5 controls the actuator 45 based on the signal from the external apparatus 6.

Accordingly, it is possible to determine whether or not there is a problem in the EUV light generation system 11*b* by switching the second points 292*a*, 292*b* by the actuator 45 and measuring the EUV light 252*a* passing through the second point 292*b* by the first EUV measurement unit 60*b*. Therefore, downtime in which the external apparatus 6 cannot be used can be reduced.

The signal from the external apparatus 6 is not limited to the EUV light NG signal. Even when the measurement result at the external apparatus 6 satisfies the first condition, for example, when a signal for allowing the transmission of the EUV light 252*a* to be stopped is received from the external apparatus 6, the EUV light generation system 11*b* can perform measurement by the first EUV measurement unit 60*b*. When the measurement result does not satisfy the second condition, processing of S57 and S58 of FIG. 13 may be performed.

(2) According to the first embodiment, the actuator 45 changes the posture of the planar mirror 43 so that the planar mirror 43 rotates about an axis in the X direction perpendicular to the first virtual plane including the first focal point of the EUV light concentrating mirror 23*a* and the second points 292*a*, 292*b*. Accordingly, the alignment of the planar mirror 43 can be accurately performed without requiring a complicated mechanism for changing the posture of the planar mirror 43. However, the present disclosure is not limited thereto. As long as the second points 292*a*, 292*b* can be switched by changing the posture of the planar mirror 43, the planar mirror 43 may be rotated about an axis in another direction.

(3) According to the first embodiment, the optical path of the EUV light 252*a* from the EUV light concentrating mirror 23*a* to the second point 292*a* or 292*b* lies on the first virtual plane including the first focal point of the EUV light concentrating mirror 23*a* and the second points 292*a*, 292*b*. Accordingly, since the optical path of the EUV light 252*a* is switched in the same plane, alignment among the first focal point, the second points 292*a*, 292*b*, and the planar mirror 43 can be easily performed.

(4) According to the first embodiment, the absolute value of the Bragg angle +θ between the reflection surface of the planar mirror 43 and the optical path axis of the EUV light 252*a* when the EUV light 252*a* is directed toward the second point 292*a* and the absolute value of the Bragg angle −θ between the reflection surface and the optical path axis when the EUV light 252*a* is directed toward the second point 292*b* are the same. Accordingly, the beam profiles at the second points 292*a*, 292*b* when the EUV light 252*a* is directed toward the second point 292*a* and when the EUV light 252*a* is directed toward the second point 292*b* are the same. Therefore, the first EUV measurement unit 60*b* can measure the same beam profile as that of the EUV light 252*a* entering the external apparatus 6.

(5) According to the first embodiment, the planar mirror 43 has a reflection surface having a reflection film, and the actuator 45 can change the posture of the planar mirror 43 so as to rotate the planar mirror 43 while the reflection surface is positioned on the optical path of the EUV light 252*a*. This can reduce the possibility that the EUV light 252*a* is incident on the holder 44 on the back surface side of the planar mirror 43. However, the present disclosure is not limited thereto. The holder 44 may be positioned on the optical path of the EUV light 252*a* during the rotation of the planar mirror 43.

(6) According to the first embodiment, the connection portion 29*a* is configured to be connectable to the second EUV measurement unit 60*a* in place of the external apparatus 6. The processor 5 performs the alignment adjustment of either the EUV light concentrating mirror 23*a* or the planar mirror 43 based on the measurement result by the second EUV measurement unit 60*a* with the EUV light 252*a* directed toward the second point 292*a*. Accordingly, it is possible to accurately perform the alignment adjustment by using the EUV light 252*a* having passed through the same optical path as the light entering the external apparatus 6. However, the present disclosure is not limited thereto. The alignment adjustment may be performed according to the result of test exposure or inspection at the external apparatus 6.

(7) According to the first embodiment, the connection portion 29*a* is configured to be connectable to the second EUV measurement unit 60*a* in place of the external apparatus 6. The processor 5 generates calibration data of the first EUV measurement unit 60*b* based on the measurement result of the second EUV measurement unit 60*a* with the EUV light 252*a* directed toward the second point 292*a* and the measurement result by the first EUV measurement unit 60*b* with the EUV light 252*a* directed toward the second point 292*b*. Accordingly, accurate measurement can be performed by correcting the characteristic difference of the EUV measurement unit.

(8) According to the first embodiment, the signal from the external apparatus 6 includes the EUV light NG signal indicating that the measurement result of the EUV light 252*a* at the external apparatus 6 does not satisfy the first condition. The processor 5 controls the actuator 45 to direct the EUV light 252*a* to the second point 292*b* when the EUV light NG signal is output from the external apparatus 6. Accordingly, it is possible to determine the cause that the first condition is not satisfied at the external apparatus 6 using the measurement result by the first EUV measurement unit 60*b*.

(9) According to the first embodiment, the processor 5 performs the alignment adjustment of the plasma generation region 25 when the measurement result by the first EUV measurement unit 60b does not satisfy the second condition. Accordingly, it is possible not only to identify the location where a problem is occurring while the EUV light generation system 11b is kept connected to the external apparatus 6, but also to solve the problem while the EUV light generation system 11b is kept connected to the external apparatus 6.

(10) According to the first embodiment, the alignment adjustment of the plasma generation region 25 includes the position adjustment of the target supply unit 26. Accordingly, it is possible to change the centroid position in the X direction and the Z direction of EUV light generated in the plasma generation region 25.

(11) According to the first embodiment, the EUV light generation system 11b further includes the laser system 3 for outputting pulse laser light. The alignment adjustment of the plasma generation region 25 includes either the position adjustment of the target supply unit 26 or the adjustment of the generation timing of the pulse laser light. Accordingly, it is possible to change the centroid position of the EUV light generated in the plasma generation region 25 not only in the X direction and the Z direction but in also in the Y direction.

(12) According to the first embodiment, when the measurement result by the first EUV measurement unit 60b satisfies the second condition, the processor 5 waits in a state in which the output of the EUV light 252a to the external apparatus 6 is stopped. Accordingly, since it is possible to concentrate on the adjustment of the external apparatus 6, downtime can be reduced.

In other respects, the first embodiment is similar to the comparative example.

4. EUV Light Generation System 11c with Improved Flexibility in Arrangement of First EUV Measurement Unit 60b

4.1 Configuration

Figure 16:
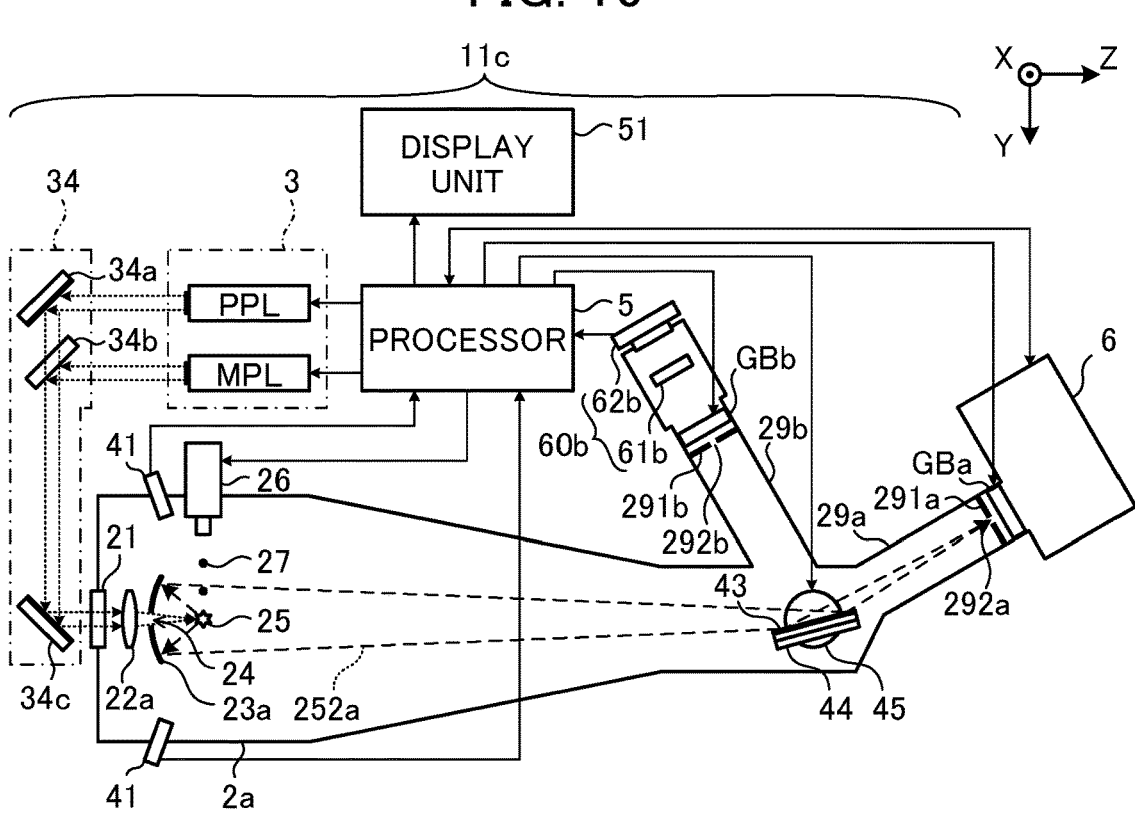
FIG. 16 schematically shows the configuration of the EUV light generation system according to a second embodiment.
Figure 17:
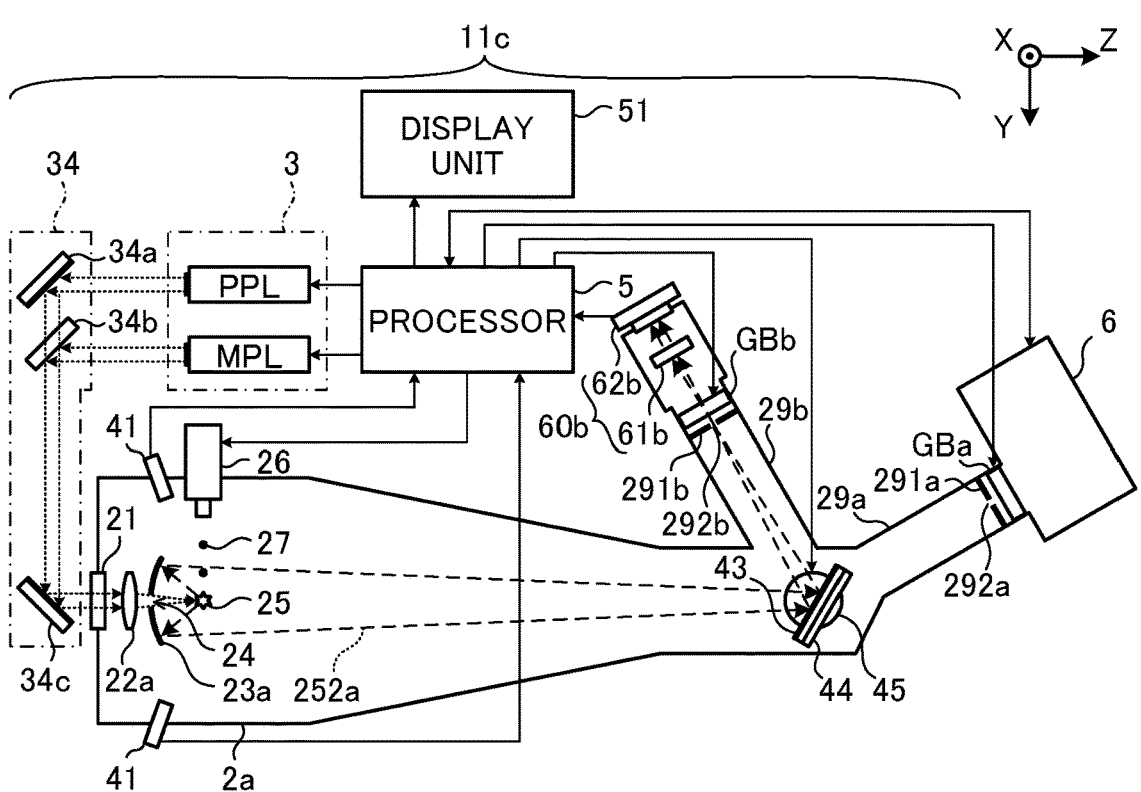
FIG. 17 schematically shows the configuration of the EUV light generation system according to the second embodiment.

FIGS. 16 and 17 schematically shows the configuration of an EUV light generation system 11c according to a second embodiment. The EUV light generation system 11c differs from that of the first embodiment in the second position of the second point 292b, the arrangement of the connection portion 29b, and the arrangement of the first EUV measurement unit 60b.

In the second embodiment, the second points 292a, 292b are not in mirror image relationship across a second virtual plane being parallel to the XZ plane and passing through the plasma generation region 25. The connection portions 29a, 29b are not at positions to be in mirror image relationship across the second virtual plane. The planar mirror 43 reflects the EUV light 252a in asymmetric directions toward the second points 292a, 292b.

Figure 18:
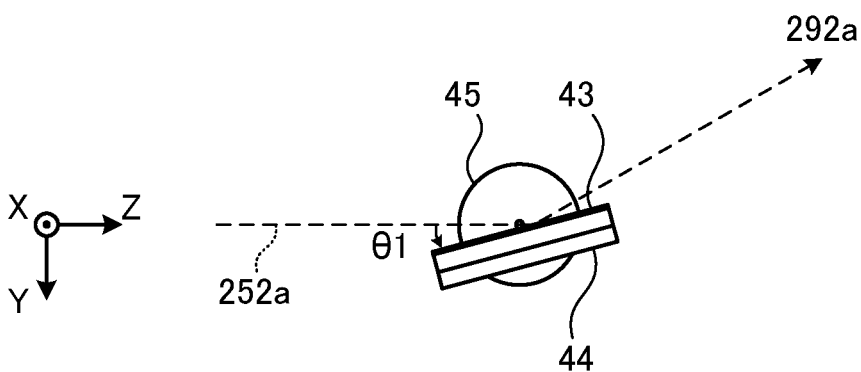
FIG. 18 is an enlarged view of the planar mirror, the holder, and the actuator shown in FIG. 16.
Figure 19:
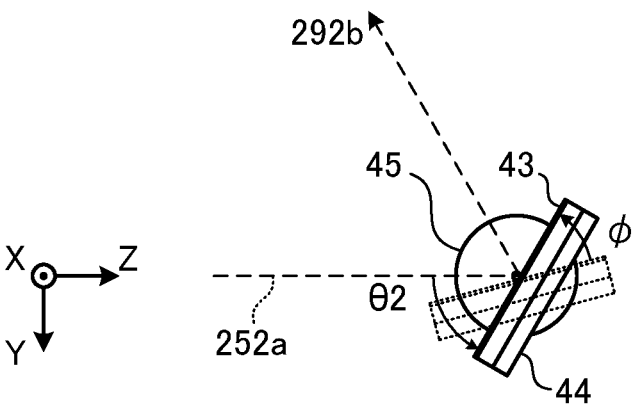
FIG. 19 is an enlarged view of the planar mirror, the holder, and the actuator shown in FIG. 17.

FIGS. 18 and 19 are enlarged views of the planar mirror 43, the holder 44, and the actuator 45 shown in FIGS. 16 and 17, respectively. As shown in FIG. 18, the Bragg angle between the planar mirror 43 and the EUV light 252a when the EUV light 252a is reflected toward the second point 292a is represented by θ1. As shown in FIG. 19, the Bragg angle between the planar mirror 43 and the EUV light 252a when the EUV light 252a is reflected toward the second point 292b is larger than that in the case of FIG. 18 and is represented by θ2. The Bragg angles θ1, θ2 are different in absolute value, and the reflectance shown in FIG. 4 is lower in the case of FIG. 19 than in the case of FIG. 18. The Bragg angles θ1, θ2 are examples of the first and second Bragg angles in the present disclosure, respectively.

In order to rotate the planar mirror 43 from the posture in which the Bragg angle is θ1 to the posture in which the Bragg angle is θ2, rotation by an angle φ is performed as shown in FIG. 19.

4.2 Operation

The processing shown in FIGS. 12 and 13 are also performed in the second embodiment. However, the calibration of the first EUV measurement unit 60b is partially different from that in the first embodiment.

FIG. 20 is a flowchart showing the detail of the operation of calibrating the first EUV measurement unit 60b in the second embodiment. The processing shown in FIG. 20 corresponds to the subroutine of S15 in FIG. 12.

In the second embodiment, the Bragg angle between the planar mirror 43 and the EUV light 252a is set to θ2 instead of −θ (S152c), so that the EUV light 252a is reflected toward the second point 292b. Further, the Bragg angle between the planar mirror 43 and the EUV light 252a is set to θ1 instead of +θ, so that the EUV light 252a is reflected toward the second point 292a.

Since the Bragg angle θ2 is larger than the Bragg angle θ1, the reflectance becomes smaller when the EUV light 252a is reflected toward the second point 292b. The measurement value of the pulse energy obtained by the first EUV measurement unit 60b is smaller than the measurement value of the pulse energy by the second EUV measurement unit 60a when the second EUV measurement unit 60a is connected to the connection portion 29a. By multiplying the measurement value of the first EUV measurement unit 60b by a correction coefficient larger than 1, it is possible to cancel the change in reflectance due to the change in the Bragg angle.

4.3 Effect

(13) According to the second embodiment, the absolute value of the Bragg angle θ2 between the reflection surface of the planar mirror 43 and the optical path axis of the EUV light 252a when the EUV light 252a is directed toward the second point 292b is larger than the absolute value of the Bragg angle θ1 between the reflection surface and the optical path axis when the EUV light 252a is directed toward the second point 292a. Accordingly, the flexibility in the arrangement of the first EUV measurement unit 60b is improved, so that the first EUV measurement unit 60b may be arranged at a location where there is room for installation space or a location where attachment and detachment are easy.

(14) According to the second embodiment, the processor 5 calculates the pulse energy of the EUV light 252a entering the external apparatus 6 by multiplying the pulse energy of the EUV light 252a obtained by the first EUV measurement unit 60b by a correction coefficient larger than 1. Accordingly, the pulse energy of the EUV light 252a can be calculated by canceling the difference in reflectance due to the difference in the Bragg angles θ1, θ2.

In other respects, the second embodiment is similar to the first embodiment.

5. EUV Light Generation System 11b Capable of Solving Malfunction Other than Alignment

5.1 Configuration and operation

A third embodiment will be described below. The configuration of the third embodiment is similar to that of the first embodiment.

Figure 21:
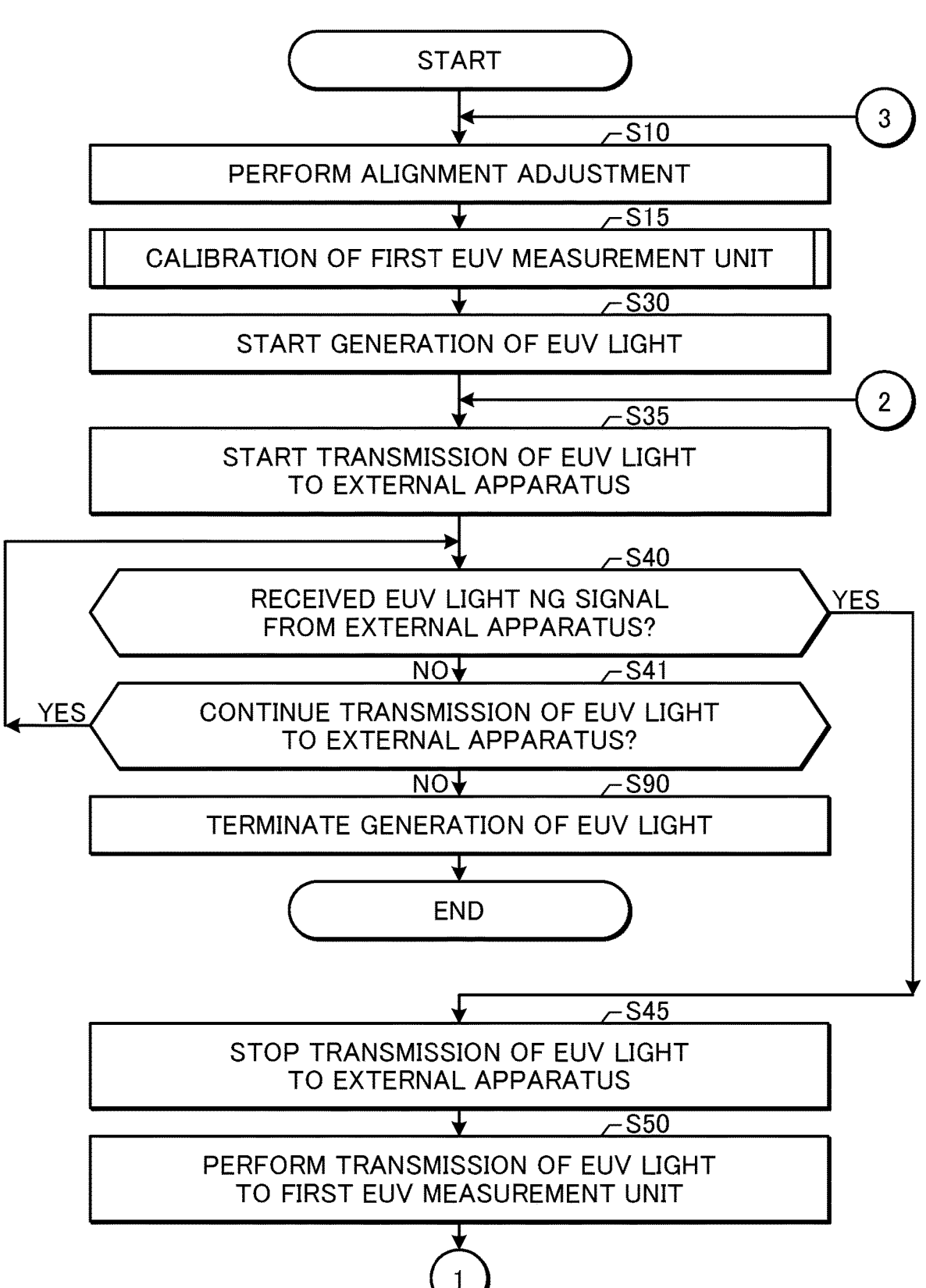
FIG. 21 is a flowchart showing the operation of the processor in a third embodiment.
Figure 22:
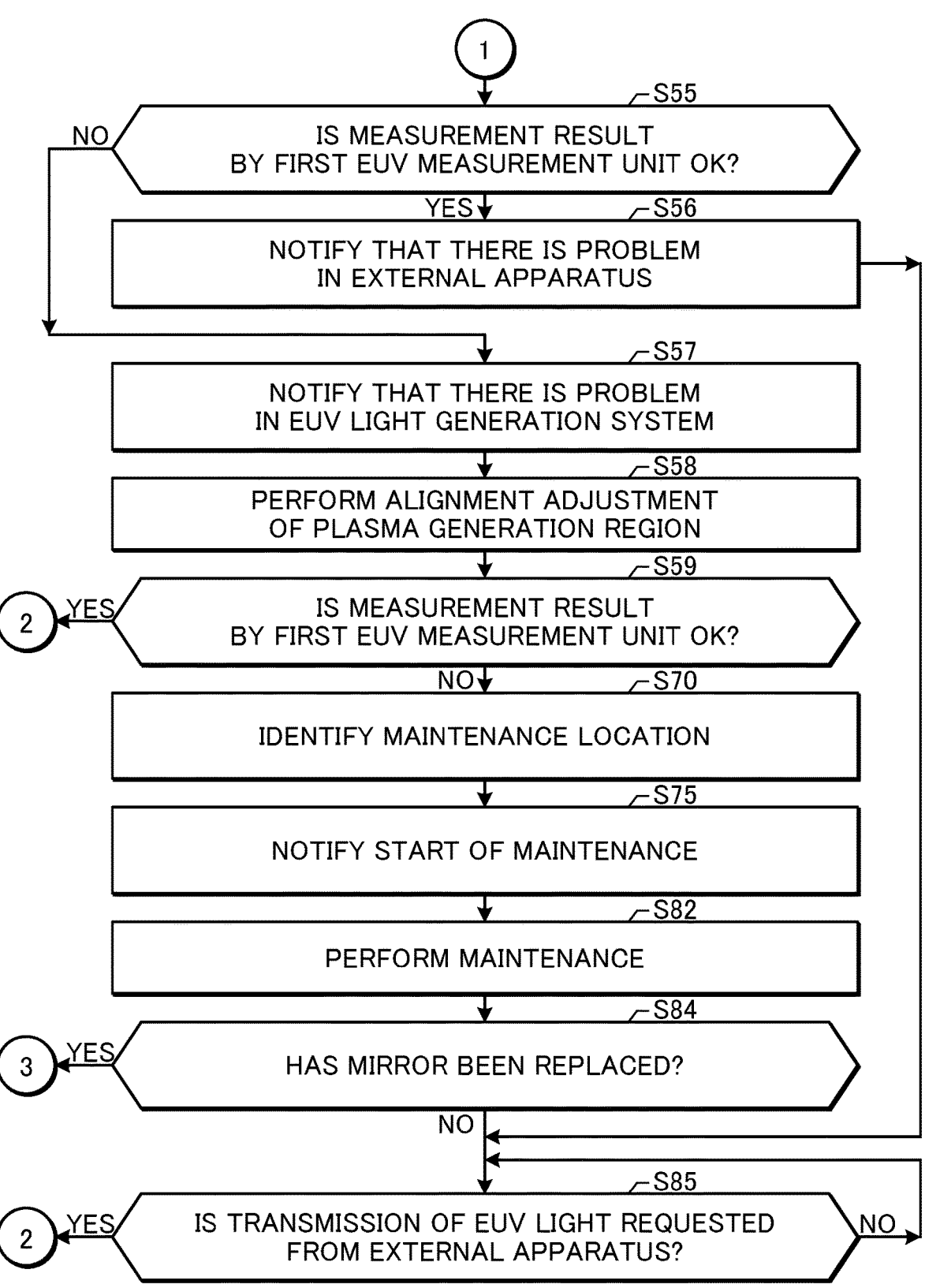
FIG. 22 is a flowchart showing the operation of the processor in the third embodiment.

FIGS. 21 and 22 are flowcharts showing the operation of the processor 5 in the third embodiment. The processing shown in FIG. 21 is similar to the processing shown in FIG. 12 except that processing returns to S10 of FIG. 21 when a mirror is replaced in FIG. 22 (S84: YES).

The processing shown in FIG. 22 is similar to the processing shown in FIG. 13 except that the processing of S59 to S84 is added.

In S59, the processor 5 determines whether or not the measurement result of the EUV light by the first EUV measurement unit 60b satisfies the second condition owing to the alignment adjustment in S58. The second condition is similar to the second condition determined in S55.

When the measurement result of the EUV light by the first EUV measurement unit 60b satisfies the second condition owing to the alignment adjustment (S59: YES), the processor 5 sets the Bragg angle between the planar mirror 43 and the EUV light 252a to +θ, and returns to S35 of FIG. 21.

When the measurement result of the EUV light by the first EUV measurement unit 60b does not satisfy the second condition even after the alignment adjustment is performed (S59: NO), the processor 5 proceeds to S70.

In S70, the processor 5 identifies the location that requires maintenance. For example, when the centroid position or the spot size of the EUV light is not normalized, it can be determined that the position of the EUV light concentrating mirror 23a is abnormal. Alternatively, when the pulse energy of the EUV light is not normalized, it can be determined that the EUV light concentrating mirror 23a or the planar mirror 43 is deteriorated. On the basis of the determination result, the location that requires maintenance is identified.

In S75, the processor 5 notifies the external apparatus 6 of the start of maintenance.

In S82, maintenance is performed. Maintenance accompanied by replacement of the EUV light concentrating mirror 23a or the planar mirror 43 is performed with the generation of the EUV light stopped. Maintenance without replacement, such as the position adjustment of the EUV light concentrating mirror 23a or the planar mirror 43, can be performed without stopping the generation of the EUV light.

After completion of maintenance, in S84, the processor 5 determines whether or not the mirror has been replaced. The mirror here is either the EUV light concentrating mirror 23a or the planar mirror 43.

When the mirror is replaced (S84: YES), the processor 5 returns to S10 of FIG. 21. Thus, the alignment adjustment of the EUV light concentrating mirror 23a and the planar mirror 43 is performed.

When the mirror has not been replaced (S84: NO), for example, when the position adjustment of the EUV light concentrating mirror 23a or the planar mirror 43 has been performed or when the EUV light detection sensor 41 has been replaced, the processor 5 proceeds to S85.

The processing of S85 is similar to that shown in FIG. 13, and the processor 5 waits until the transmission of the EUV light is requested from the external apparatus 6. When the transmission of the EUV light is requested from the external apparatus 6 (S85: YES), the processor 5 returns to S35 of FIG. 21.

5.2 Effect

(15) According to the third embodiment, the processor 5 performs the alignment adjustment of the target supply unit 26 when the measurement result by the first EUV measurement unit 60b does not satisfy the second condition. When the measurement result by the first EUV measurement unit 60b does not satisfy the second condition even after the position adjustment is performed, the processor 5 stops the generation of the EUV light 252b for maintenance of the EUV light generation system 11b. Accordingly, when there is a problem other than alignment in the EUV light generation system 11b, the problem can be solved without disconnecting the external apparatus 6, so that downtime can be reduced.

(16) According to the third embodiment, when performing maintenance on the EUV light generation system 11b, the processor 5 notifies the external apparatus 6 that maintenance is to be performed. Accordingly, it is possible to notify the external apparatus 6 that it takes time to solve the problem, and it is possible to reduce the consumption of resources in the external apparatus 6.

(17) According to the third embodiment, maintenance includes replacement of either the EUV light concentrating mirror 23a or the planar mirror 43. Accordingly, when the problem is solved by replacing the mirror, the problem can be solved without disconnecting the external apparatus 6, so that the downtime can be reduced.

(18) According to the third embodiment, the connection portion 29a is configured to be connectable to the second EUV measurement unit 60a in place of the external apparatus 6. When either the EUV light concentrating mirror 23a or the planar mirror 43 is replaced, the alignment adjustment of either the EUV light concentrating mirror 23a or the planar mirror 43 is performed based on the measurement result by the second EUV measurement unit 60a with the EUV light 252a directed toward the second point 292a. Accordingly, when the alignment adjustment is necessary due to the replacement of the mirror, the operation can be performed without disconnecting the external apparatus 6.

In other respects, the third embodiment is similar to the first embodiment. Alternatively, in the third embodiment, similarly to the second embodiment, the planar mirror 43 may reflect the EUV light 252a in asymmetric directions.

6. Others

Figure 23:
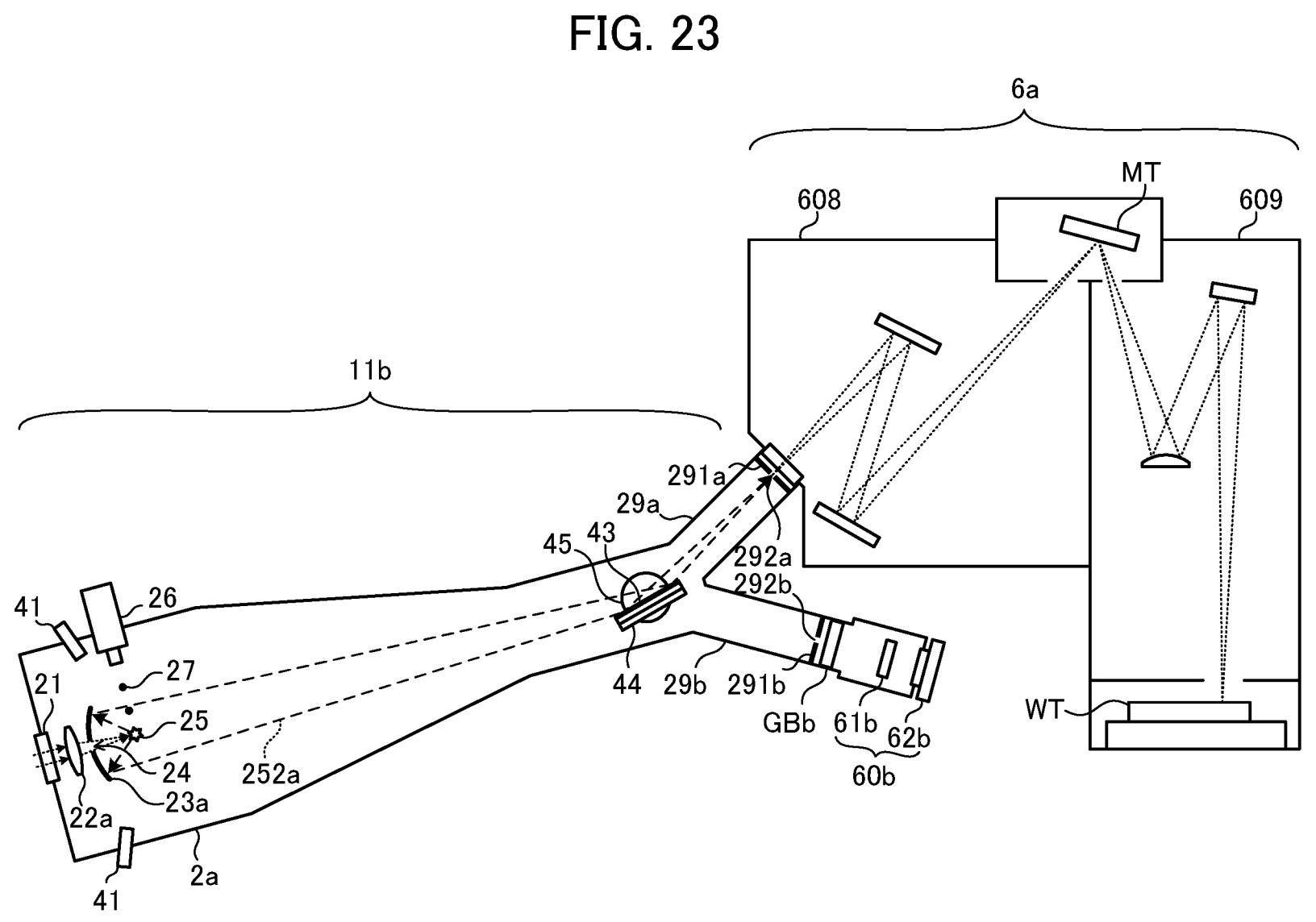

FIG. 23 schematically shows the configuration of an exposure apparatus 6a connected to the EUV light generation system 11b.

In FIG. 23, the exposure apparatus 6a as the external apparatus 6 (see FIG. 1) includes a mask irradiation unit 608 and a workpiece irradiation unit 609. The mask irradiation unit 608 illuminates, via a reflection optical system, a mask pattern of a mask table MT with the EUV light incident from the EUV light generation system 11b. The workpiece irradiation unit 609 images the EUV light reflected by the mask table MT onto a workpiece (not shown) arranged on a workpiece table WT via the reflection optical system. The workpiece is a photosensitive substrate such as a semiconductor wafer on which photoresist is applied. The exposure apparatus 6a synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 24:
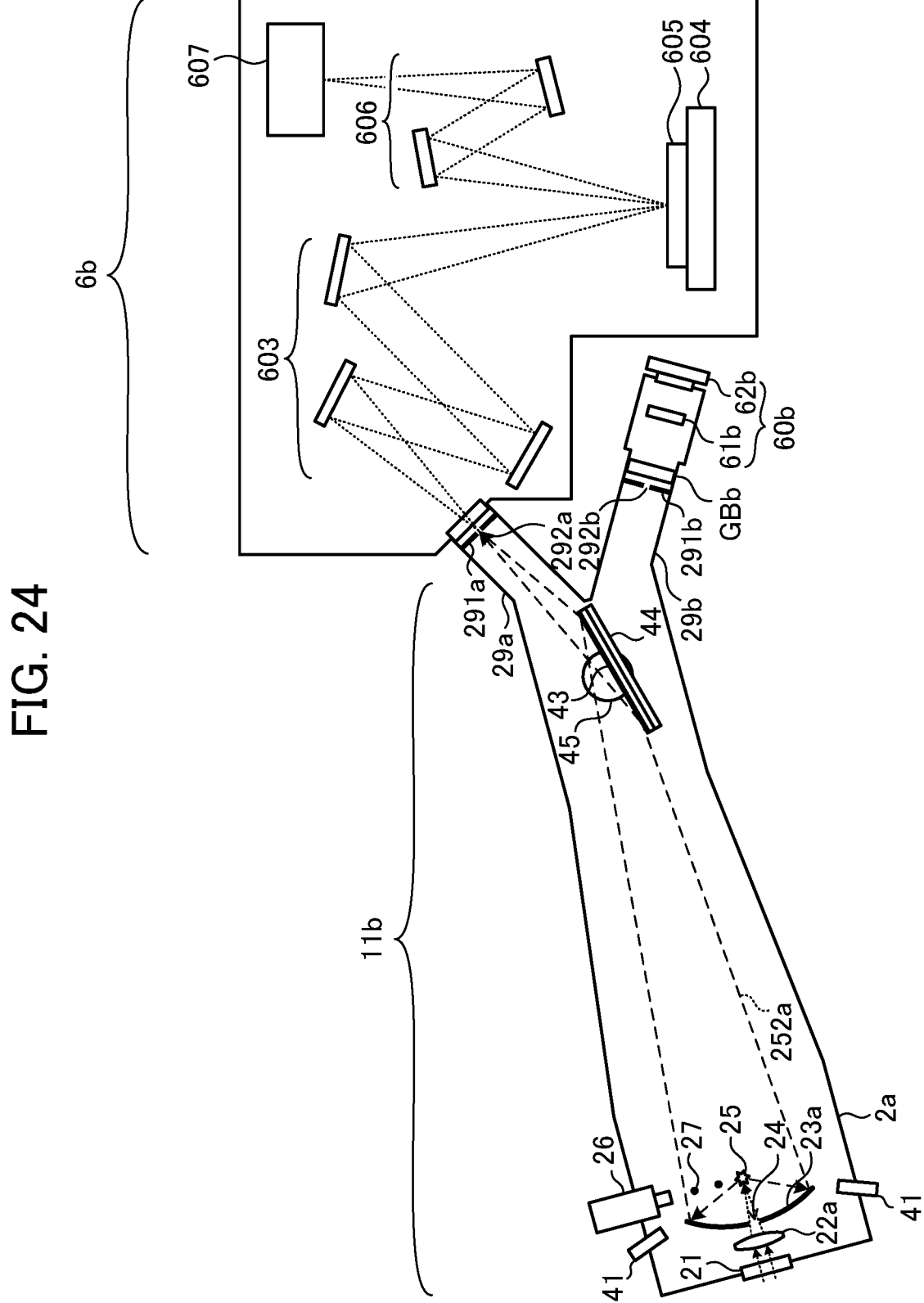
FIG. 24 schematically shows the configuration of an inspection apparatus connected to the EUV light generation system.

FIG. 24 schematically shows the configuration of an inspection apparatus 6b connected to the EUV light generation system 11b.

In FIG. 24, the inspection apparatus 6b as the external apparatus 6 (see FIG. 1) includes an illumination optical system 603 and a detection optical system 606. The Illumination optical system 603 reflects the EUV light incident from the EUV light generation system 11*b* to illuminate a mask 605 placed on a mask stage 604.

Here, the mask 605 conceptually includes a mask blanks before a pattern is formed. The detection optical system 606 reflects the EUV light from the illuminated mask 605 and forms an image on a light receiving surface of a detector 607. The detector 607 having received the EUV light obtains the image of the mask 605. The detector 607 is, for example, a time delay integration (TDI) sensor of a CCD camera. A defect of the mask 605 is inspected based on the image of the mask 605 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6*a*.

In FIGS. 23 and 24, the EUV light generation system 11*c* may be used instead of the EUV light generation system 11*b*.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. An extreme ultraviolet light generation system, comprising:

a chamber;

a target supply unit configured to supply a target substance to a plasma generation region including a first point in the chamber;

a window configured to allow pulse laser light with which the target substance is irradiated to pass therethrough;

an EUV light concentrating mirror configured to concentrate, on a second point, extreme ultraviolet light generated at the first point;

a planar mirror arranged on an optical path of the extreme ultraviolet light reflected by the EUV light concentrating mirror and arranged between the first point included in the plasma generation region and the second point;

an actuator configured to cause the second point to be switched between a first position and a second position by changing a posture of the planar mirror;

a connection portion configured to be connectable to an external apparatus which the extreme ultraviolet light having passed through the first position enters;

a first EUV measurement unit on which the extreme ultraviolet light having passed through the second position is incident; and a processor configured to control the actuator based on a signal from the external apparatus, wherein the signal includes an EUV light NG signal indicating that a measurement result of the extreme ultraviolet light at the external apparatus does not satisfy a first condition, the processor controls the actuator to move the second point, at which the EUV light is concentrated by the EUV light concentrating mirror, from the first position to the second position when the EUV light NG signal is output from the external apparatus, when the processor controls the actuator to set the second point to the first position, the planar mirror reflects the extreme ultraviolet light toward the external apparatus through the first position, and when the processor controls the actuator to set the second point to the second position, the planar mirror reflects the extreme ultraviolet light toward the EUV measurement unit.

2. The extreme ultraviolet light generation system according to claim 1, wherein the actuator changes the posture of the planar mirror so that the planar mirror rotates about an axis perpendicular to a virtual plane including the first point, the first position, and the second position.

3. The extreme ultraviolet light generation system according to claim 1, wherein an optical path of the extreme ultraviolet light from the EUV light concentrating mirror to the second point lies on a virtual plane including the first point, the first position, and the second position.

4. The extreme ultraviolet light generation system according to claim 1, wherein an absolute value of a first Bragg angle between a reflection surface of the planar mirror and an optical path axis of the extreme ultraviolet light when the second point is set to the first position and an absolute value of a second Bragg angle between the reflection surface and the optical path axis when the second point is set to the second position are the same.

5. The extreme ultraviolet light generation system according to claim 1, wherein the planar mirror has a reflection surface having a reflection film, and the actuator changes the posture of the planar mirror so as to rotate the planar mirror while the reflection surface is positioned on the optical path of the extreme ultraviolet light.

6. The extreme ultraviolet light generation system according to claim 1, wherein the connection portion is configured to be connectable to a second EUV measurement unit instead of the external apparatus, and the processor performs alignment adjustment of either the EUV light concentrating mirror or the planar mirror based on a measurement result of the extreme ultraviolet light by the second EUV measurement unit with the second point set to the first position.

7. The extreme ultraviolet light generation system according to claim 1, wherein the connection portion is configured to be connectable to a second EUV measurement unit instead of the external apparatus, and the processor generates calibration data of the first EUV measurement unit based on a measurement result of the extreme ultraviolet light by the second EUV measurement unit with the second point set to the first position and a measurement result of the extreme ultraviolet light by the first EUV measurement unit with the second point set to the second position.

8. The extreme ultraviolet light generation system according to claim 1, wherein the processor performs alignment adjustment of the plasma generation region when a measurement result by the first EUV measurement unit does not satisfy a second condition.

9. The extreme ultraviolet light generation system according to claim 8, wherein the alignment adjustment includes position adjustment of the target supply unit.

10. The extreme ultraviolet light generation system according to claim 8, further comprising a laser system configured to output the pulse laser light, wherein the alignment adjustment includes either position adjustment of the target supply unit or adjustment of a generation timing of the pulse laser light.

11. The extreme ultraviolet light generation system according to claim 8, wherein the processor waits in a state in which output of the extreme ultraviolet light to the external apparatus is stopped when the measurement result by the first EUV measurement unit satisfies the second condition.

12. The extreme ultraviolet light generation system according to claim 1, wherein an absolute value of a first Bragg angle between a reflection surface of the planar mirror and an optical path axis of the extreme ultraviolet light when the second point is set to the first position is larger than an absolute value of a second Bragg angle between the reflection surface and the optical path axis when the second point is set to the second position.

13. The extreme ultraviolet light generation system according to claim 12, wherein the processor calculates pulse energy of the extreme ultraviolet light entering the external apparatus by multiplying pulse energy of the extreme ultraviolet light obtained by the first EUV measurement unit by a correction coefficient.

14. The extreme ultraviolet light generation system according to claim 1, wherein the processor performs position adjustment of the target supply unit when a measurement result by the first EUV measurement unit does not satisfy a second condition, and when the measurement result by the first EUV measurement unit does not satisfy the second condition even after the position adjustment is performed, the processor stops generation of the extreme ultraviolet light for maintenance of the extreme ultraviolet light generation system.

15. The extreme ultraviolet light generation system according to claim 14, wherein the processor notifies the external apparatus that maintenance is to be performed when the maintenance is to be performed.

16. The extreme ultraviolet light generation system according to claim 14, wherein the maintenance includes replacement of either the EUV light concentrating mirror or the planar mirror.

17. The extreme ultraviolet light generation system according to claim 16, wherein the connection portion is configured to be connectable to a second EUV measurement unit instead of the external apparatus, and when either the EUV light concentrating mirror or the planar mirror is replaced, alignment adjustment of either the EUV light concentrating mirror or the planar mirror is performed based on a measurement result of the extreme ultraviolet light by the second EUV measurement unit with the second point set to the first position.

18. An electronic device manufacturing method, comprising:

generating extreme ultraviolet light using an extreme ultraviolet light generation system;

outputting the extreme ultraviolet light to an external apparatus which is an exposure apparatus; and exposing a photosensitive substrate to the extreme ultraviolet light in the exposure apparatus to manufacture an electronic device, the extreme ultraviolet light generation system including:

a chamber;

a target supply unit configured to supply a target substance to a plasma generation region including a first point in the chamber;

a window configured to allow pulse laser light with which the target substance is irradiated to pass therethrough;

an EUV light concentrating mirror configured to concentrate, on a second point, the extreme ultraviolet light generated at the first point;

a planar mirror arranged on an optical path of the extreme ultraviolet light reflected by the EUV light concentrating mirror and arranged between the first point included in the plasma generation region and the second point;

an actuator configured to cause the second point to be switched between a first position and a second position by changing a posture of the planar mirror;

a connection portion configured to be connectable to the external apparatus which the extreme ultraviolet light having passed through the first position enters;

a first EUV measurement unit on which the extreme ultraviolet light having passed through the second position is incident; and a processor configured to control the actuator based on a signal from the external apparatus, wherein the signal includes an EUV light NG signal indicating that a measurement result of the extreme ultraviolet light at the external apparatus does not satisfy a first condition, the processor controls the actuator to move the second point, at which the EUV light is concentrated by the EUV light concentrating mirror, from the first position to the second position when the EUV light NG signal is output from the external apparatus, when the processor controls the actuator to set the second point to the first position, the planar mirror reflects the extreme ultraviolet light toward the external apparatus through the first position, and when the processor controls the actuator to set the second point to the second position, the planar mirror reflects the extreme ultraviolet light toward the EUV measurement unit.

19. An electronic device manufacturing method, comprising:

inspecting a defect of a mask by irradiating the mask in an external apparatus which is an inspection apparatus with extreme ultraviolet light generated by an extreme ultraviolet light generation system;

selecting a mask using a result of the inspection; and exposing and transferring a pattern formed on the selected mask onto a photosensitive substrate,

the extreme ultraviolet light generation system including:

a chamber;

a target supply unit configured to supply a target substance to a plasma generation region including a first point in the chamber;

a window configured to allow pulse laser light with which the target substance is irradiated to pass therethrough;

an EUV light concentrating mirror configured to concentrate, on a second point, the extreme ultraviolet light generated at the first point;

a planar mirror arranged on an optical path of the extreme ultraviolet light reflected by the EUV light concentrating mirror and arranged between the first point included in the plasma generation region and the second point;

an actuator configured to cause the second point to be switched between a first position and a second position by changing a posture of the planar mirror;

a connection portion configured to be connectable to the external apparatus which the extreme ultraviolet light having passed through the first position enters, a first EUV measurement unit on which the extreme ultraviolet light having passed through the second position is incident; and

24 a processor configured to control the actuator based on a signal from the external apparatus, wherein the signal includes an EUV light NG signal indicating that a measurement result of the extreme ultraviolet light at the external apparatus does not satisfy a first condition, the processor controls the actuator to move the second point, at which the EUV light is concentrated by the EUV light concentrating mirror, from the first position to the second position when the EUV light NG signal is output from the external apparatus, when the processor controls the actuator to set the second point to the first position, the planar mirror reflects the extreme ultraviolet light toward the external apparatus through the first position, and when the processor controls the actuator to set the second point to the second position, the planar mirror reflects the extreme ultraviolet light toward the EUV measurement unit.

* * * * *